US012593590B2

(12) United States Patent
Lee

(10) Patent No.: US 12,593,590 B2
(45) Date of Patent: Mar. 31, 2026

(54) DISPLAY DEVICE INCLUDING COLOR FILTER HAVING LIGHT TRANSMITTANCE OF 80% OR LESS AND ELECTRONIC DEVICE INCLUDING THE SAME

(71) Applicant: Samsung Display Co., Ltd., Yongin-si (KR)

(72) Inventor: Hyeonbum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 809 days.

(21) Appl. No.: 17/744,123

(22) Filed: May 13, 2022

(65) Prior Publication Data

US 2023/0012798 A1     Jan. 19, 2023

(30) Foreign Application Priority Data

Jul. 14, 2021     (KR) ......................... 10-2021-0092372

(51) Int. Cl.
| | |
|---|---|
| *H10K 59/38* | (2023.01) |
| *H10K 50/84* | (2023.01) |
| *H10K 59/122* | (2023.01) |
| *H10K 59/40* | (2023.01) |
| *H10K 59/80* | (2023.01) |
| *H10K 50/858* | (2023.01) |
| *H10K 50/86* | (2023.01) |

(52) U.S. Cl.
CPC ........... *H10K 59/38* (2023.02); *H10K 59/122* (2023.02); *H10K 59/40* (2023.02); *H10K 59/873* (2023.02); *H10K 59/878* (2023.02); *H10K 59/879* (2023.02); *H10K 59/8792* (2023.02)

(58) Field of Classification Search
None
See application file for complete search history.

(56) References Cited

U.S. PATENT DOCUMENTS

| | | | |
|---|---|---|---|
| 7,212,261 B2 | 5/2007 | Rho | |
| 10,768,470 B2 | 9/2020 | Park et al. | |
| 10,840,313 B2 | 11/2020 | Jang et al. | |
| 11,217,631 B2 | 1/2022 | Lee | |
| 11,258,049 B2 | 2/2022 | Kim et al. | |
| 11,515,500 B2 | 11/2022 | Lee et al. | |
| 2009/0015770 A1* | 1/2009 | Ito ..................... | G02F 1/133514 349/108 |

(Continued)

FOREIGN PATENT DOCUMENTS

| | | |
|---|---|---|
| JP | 2015-162280 A | 9/2015 |
| KR | 10-0984353 B1 | 10/2010 |

(Continued)

*Primary Examiner* — Sue A Purvis
*Assistant Examiner* — Seyon Ali-Simah Punchbeddell
(74) *Attorney, Agent, or Firm* — Womble Bond Dickinson (US) LLP

(57) ABSTRACT

A display device is provided to include a display panel including a plurality of light emitting elements, and a plurality of color filters disposed to overlap the plurality of light emitting elements, respectively. The plurality of color filters may include first color filters having a light transmittance of 80% or less and second color filters that have higher light transmittance to a first color light than the first color filters and have lower light transmittance to a second color light than the first color filters.

20 Claims, 20 Drawing Sheets

(56) References Cited

U.S. PATENT DOCUMENTS

| | | | | |
|---|---|---|---|---|
| 2013/0038205 A1* | 2/2013 | Nakamura | ............. | G02B 5/201 |
| | | | | 313/504 |
| 2016/0087247 A1* | 3/2016 | Kim | ................... | H10K 59/8792 |
| | | | | 257/40 |
| 2017/0076678 A1* | 3/2017 | Lee | ........................ | G02F 1/1336 |
| 2017/0346043 A1 | 11/2017 | Lee et al. | | |
| 2018/0095195 A1* | 4/2018 | Kim | ........................ | G02B 5/003 |
| 2019/0273122 A1* | 9/2019 | Iwasaki | ............... | H10K 50/841 |
| 2019/0371865 A1* | 12/2019 | Lee | .................... | H10K 59/8792 |
| 2020/0041709 A1* | 2/2020 | Lee | ........................ | G02B 5/201 |
| 2020/0075682 A1* | 3/2020 | Jeong | .................... | H10K 59/40 |
| 2020/0194727 A1* | 6/2020 | Kim | .................... | H10K 50/858 |
| 2021/0118959 A1* | 4/2021 | Sano | .................... | H10K 59/876 |
| 2021/0273021 A1 | 9/2021 | Lee et al. | | |
| 2021/0305344 A1* | 9/2021 | Negishi | .................. | H10K 59/38 |
| 2021/0359017 A1* | 11/2021 | Koshihara | ............ | H10K 59/878 |

FOREIGN PATENT DOCUMENTS

| | | | |
|---|---|---|---|
| KR | 10-2016-0095315 A | 8/2016 |
| KR | 10-2019-0080312 A | 7/2019 |
| KR | 10-2019-0095630 A | 8/2019 |
| KR | 10-2019-0115131 A | 10/2019 |
| KR | 10-2020-0063377 A | 6/2020 |
| KR | 10-2021-0004006 A | 1/2021 |
| KR | 10-2021-0028170 A | 3/2021 |
| KR | 10-2021-0057874 A | 5/2021 |

* cited by examiner

DISPLAY DEVICE INCLUDING COLOR FILTER HAVING LIGHT TRANSMITTANCE OF 80% OR LESS AND ELECTRONIC DEVICE INCLUDING THE SAME

CROSS-REFERENCE TO RELATED APPLICATION

This application claims priority to and the benefit of Korean Patent Application No. 10-2021-0092372, filed on Jul. 14, 2021, the entire content of which is hereby incorporated by reference.

BACKGROUND

The present disclosure herein relates to a display device, and more particularly, to a display device including an anti-reflection member.

Various electronic devices such as televisions, mobile phones, tablet computers, navigation devices, and game consoles are being developed. These electronic devices may each have a display device for displaying an image.

A reflection phenomenon caused by external natural light may occur in the display device, and this reflection phenomenon may reduce the visibility of the display device. In addition, the display device may be affected by external ultraviolet light. As the display device is continuously exposed to ultraviolet light, the colors of the display device may vary.

SUMMARY

Aspects of embodiments of the present disclosure are directed toward a display device with improved reliability. Specifically, aspects of embodiments of the present disclosure are directed toward a display device in which the reduction of visibility caused by external light reflection is improved. Aspects of embodiments of the present disclosure are also directed toward a display device in which the phenomenon that the colors of the display device are changed by ultraviolet light is reduced or prevented.

An embodiment of the present disclosure provides a display device including: a display panel including a plurality of light emitting elements; and a plurality of color filters arranged to overlap the plurality of light emitting elements, respectively, wherein the plurality of color filters includes first color filters having a light transmittance of about 80% or less and second color filters that have higher light transmittance to a first color light than the first color filters and have lower light transmittance to a second color light than the first color filters.

In an embodiment, each of the first color filters may have a light transmittance of about 50% or more to each of the first color light and the second color light.

In an embodiment, each of the first color light and the second color light may be one selected from a red light, a green light, and a blue light, and the second color light may be different from the first color light.

In an embodiment, the display device may further include an overcoating layer on the plurality of color filters, wherein the overcoating layer may include the same material as the first color filters.

In an embodiment, the plurality of color filters may further include third color filters that have higher light transmittance to the second color light than the first color filters and have lower light transmittance to the first color light than the first color filters.

In an embodiment, the plurality of light emitting elements may include first light emitting elements configured to emit the first color light, second light emitting elements configured to emit the second color light, and third light emitting elements configured to emit a third color light different from each of the first color light and the second color light, and the first color filters may overlap the third light emitting elements, respectively, the second color filters may overlap the first light emitting elements, respectively, and the third color filters may overlap the second light emitting elements, respectively.

In an embodiment, the first color filters may be spaced apart from each other in a plan view.

In an embodiment, the first color filters may be connected to each other in a plan view and each of the second color filters and the third color filters may be spaced from each other with the first color filters interposed therebetween.

In an embodiment, the display device may further include a light shielding pattern on the display panel wherein the light shielding pattern may have a plurality of openings defined therein and respectively corresponding to the plurality of light emitting elements, and the first color filters, the second color filters, and the third color filters may be on the plurality of openings, respectively.

In an embodiment, a portion of the second color filters and a portion of the third color filters may overlap each other on the light shielding pattern.

In an embodiment, the display device may further include an input sensing layer which is on the display panel to detect an external input, wherein the input sensing layer may include a first conductive layer, a first insulating layer on the first conductive layer, a second conductive layer on the first insulating layer, and a second insulating layer on the second conductive layer.

In an embodiment, the first color filters and the second color filters may each be on the input sensing layer.

In an embodiment, the first color filters may each be below the input sensing layer and the second color filters may each be above the input sensing layer.

In an embodiment, the display panel may further include: a pixel defining film in which a plurality of light emitting openings are defined; and an encapsulation layer on the plurality of light emitting elements, wherein the plurality of light emitting elements may be disposed to correspond to the plurality of light emitting openings, respectively, and the pixel defining film may include a black pigment and/or a black dye.

In an embodiment, the display panel may further include a low reflection layer disposed between the plurality of light emitting elements and the encapsulation layer, and the low reflection layer may include a metal material.

In an embodiment, the display panel may have a hole defined therein and passing therethrough, and may further include a compensation layer around the hole, and the compensation layer may not overlap the plurality of light emitting elements and may include the same material as the first color filters.

In an embodiment, the display device may further include a first refractive layer on the plurality of color filters and a second refractive layer on the first refractive layer, wherein the first refractive layer may have a plurality of openings defined therein and respectively corresponding to the plurality of light emitting elements, the second refractive layer may fill the plurality of openings, and a refractive index of the second refractive layer may be larger than that of the first refractive layer.

In an embodiment of the present disclosure, a display device includes a display panel including a plurality of light emitting elements, an input sensing layer which is on the display panel and includes at least one conductive layer and at least one insulating layer; and a plurality of color filters which are on the input sensing layer and overlap the plurality of light emitting elements, respectively; and, wherein the plurality of color filters include a gray filter, a first color filter, and a second color filter different from the first color filter, the first color filter and the second color filter are at least selected from a red color filter, a green color filter, and a blue color filter, and the gray filter transmits 50% or more of each of a red light, a green light, and a blue light.

In an embodiment, the gray filter may have light transmittance of 80% or less to each of the red light, the green light, and the blue light.

In an embodiment, the first color filter may be a red color filter, and the second color filter may be a blue color filter.

BRIEF DESCRIPTION OF THE FIGURES

The accompanying drawings are included to provide a further understanding of the present disclosure, and are incorporated in and constitute a part of this specification. The drawings show illustrative embodiments of the present disclosure and, together with the description, serve to explain principles of the present disclosure. In the drawings:

FIGS. 9A and 9B are cross-sectional views of display devices according to embodiments of the present disclosure taken along line III-III' of FIG. 6C;

FIG. 10 is a cross-sectional view of a display device according to an embodiment of the present disclosure.

DETAILED DESCRIPTION

Figure 1A:
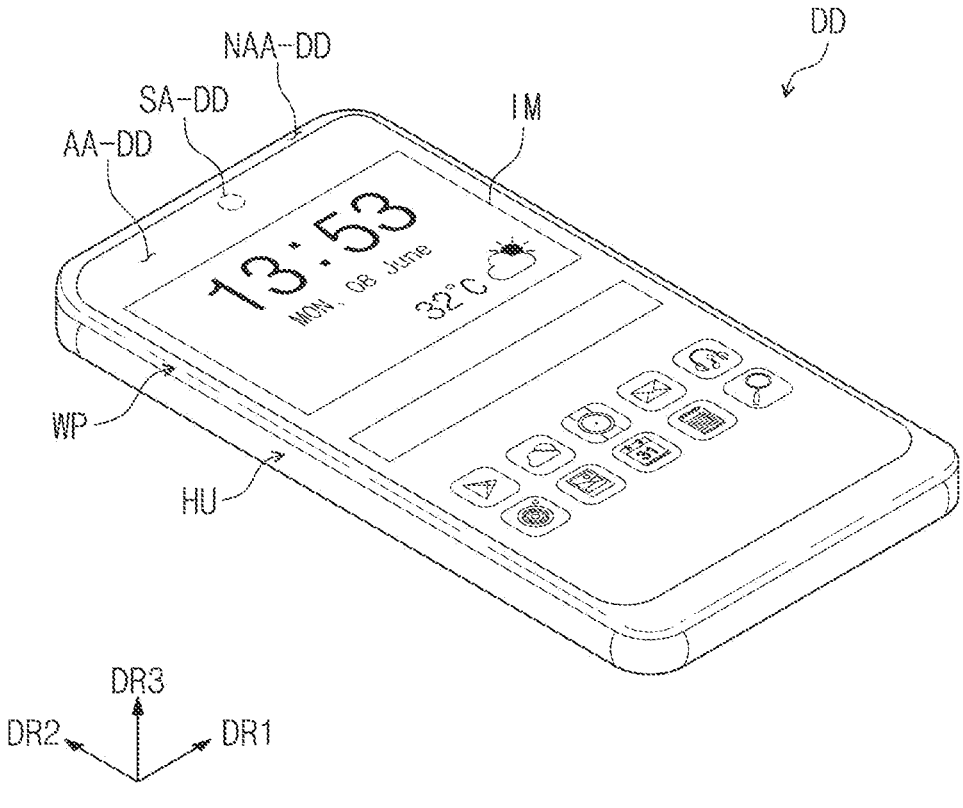
FIG. 1A is a perspective view of a display device according to an embodiment of the present disclosure.

Embodiments of the present disclosure may be modified in many alternate forms, and thus specific embodiments will be examples in the drawings and described in more detail. It should be understood, however, that it is not intended to limit the embodiments of the present disclosure to the particular forms disclosed, but rather, is intended to cover all modifications, equivalents, and alternatives falling within the spirit and scope of the invention.

It will be understood that when an element or layer is referred to as being "on", "connected to" or "coupled to" another element or layer, it can be directly on, connected or coupled to the other element or layer, or intervening elements or layers may be present. In addition, it will also be understood that when an element or layer is referred to as being "between" two elements or layers, it can be the only element or layer between the two elements or layers, or one or more intervening elements or layers may also be present.

Like reference numerals refer to like elements throughout. Also, in the drawings, the thickness, the ratio, and the dimensions of elements may be exaggerated for an effective description of technical contents. The term "and/or" includes all of one or more combinations that can be defined by associated items.

It will be understood that, although the terms "first," "second," etc. may be used herein to describe various components, these components should not be limited by these terms. These terms are only used to distinguish one component from another. For example, a first component may be referred to as a second component, and, similarly, the second component may be referred to as the first component, without departing from the scope of the inventive concept. As used herein, the singular forms, "a", "an" and "the" are intended to include the plural forms as well, unless the context clearly indicates otherwise.

In addition, terms such as "below", "under", "on", and "above" may be used to describe the relationship between elements illustrated in the figures. The terms are used as a relative concept and are described with reference to the direction indicated in the drawings.

It should be understood that the terms "comprise", "include" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept pertains. Terms as defined in a commonly used dictionary should be construed as having the same meaning as in an associated technical context, and unless defined in the description, the terms are not ideally or excessively construed as having formal meaning.

Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Hereinafter, a display device according to embodiments of the present disclosure will be described with reference to the drawings.

Figure 1B:
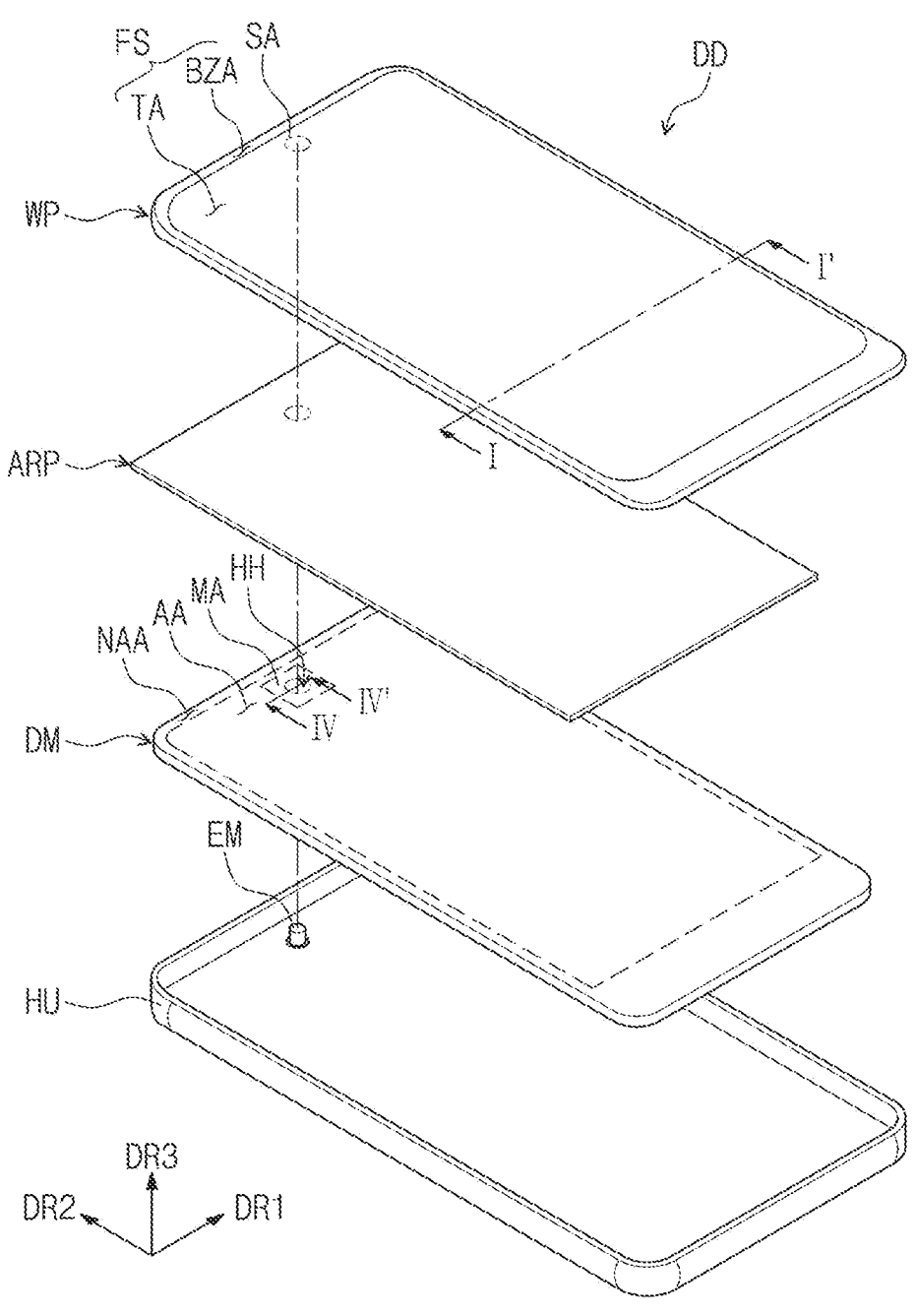
FIG. 1B is an exploded perspective view of a display device according to an embodiment of the present disclosure.
Figure 2A:
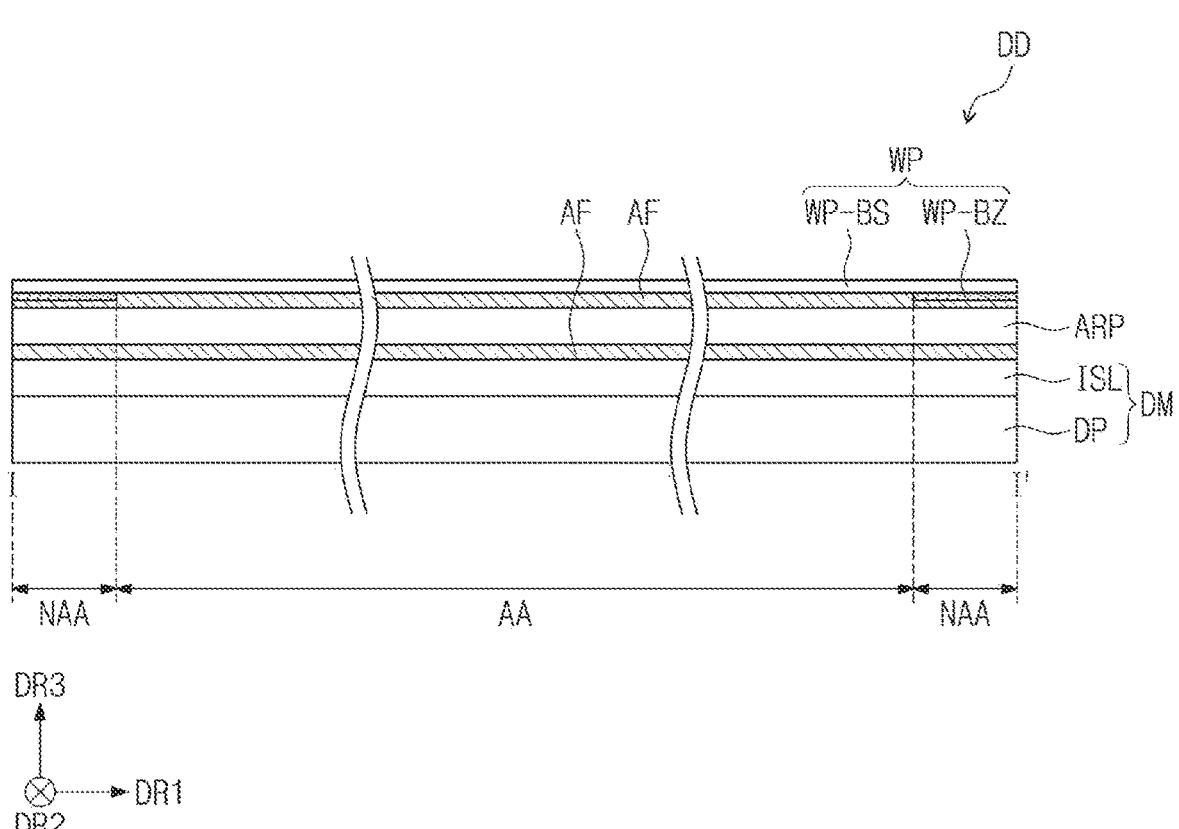
FIGS. 2A and 2B are cross-sectional views of display devices according to embodiments of the present disclosure taken along line I-I' of FIG. 1B.
Figure 2B:
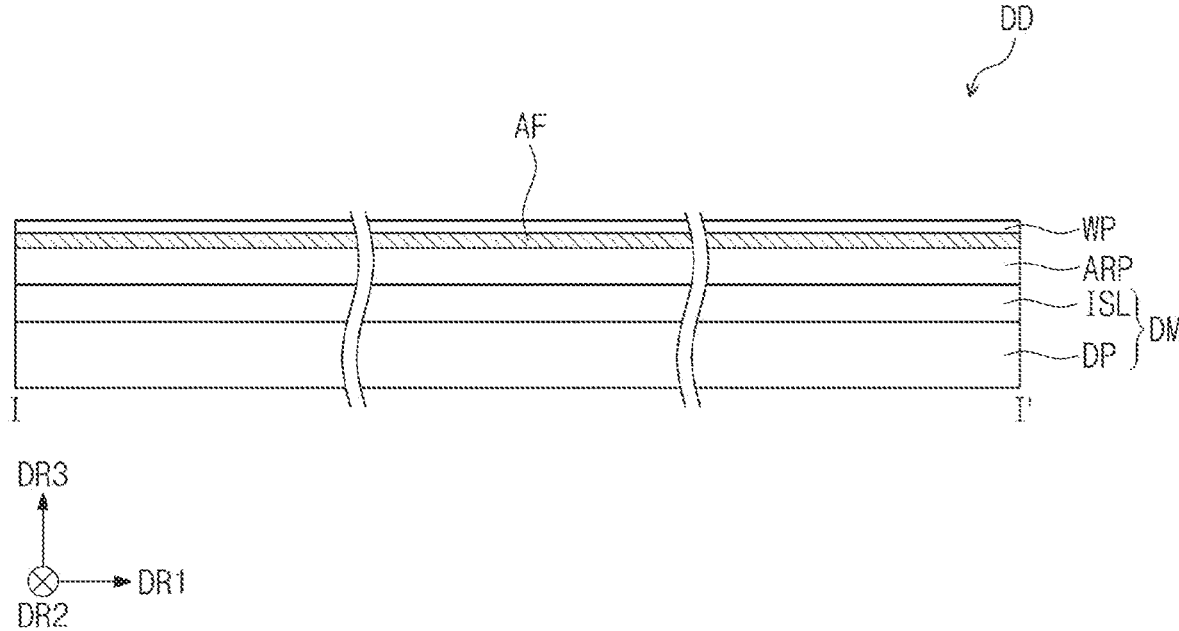

FIG. 1A is a perspective view of a display device according to an embodiment. FIG. 1B is an exploded perspective view of a display device according to an embodiment. FIGS. 2A and 2B are cross-sectional views of display devices according to embodiments taken along the line I-I' of FIG. 1B.

The display device DD may be a device activated in response to an electrical signal. The display device DD may include various examples. For example, the display device DD may include large-sized devices such as televisions and outdoor advertising boards, and small and middle-sized devices such as mobile phones, tablet computers, navigation devices, and game consoles. Meanwhile, embodiments of the display devices DD are presented as examples, and thus the display device DD is not limited to any of the above as long as it does not depart from the inventive concept. The present embodiment illustrates a mobile phone as an example of the display device DD.

Referring to FIG. 1A, the display device DD may display an image IM in a third direction DR3 through a display surface parallel to a plane defined by a first direction DR1 and a second direction DR2. The third directional DR3 may be parallel to the normal direction of the display surface. The display surface on which the image IM is displayed may correspond to a front surface of the display device DD. The IM may include a still image as well as a dynamic image. FIG. 1A illustrates a clock and a plurality of icons as an example of the image IM.

In this embodiment, a front surface (or a top surface) and a rear surface (or a bottom surface) of each side of the device (e.g., member or unit) may be defined based on the direction in which the image IM is displayed. The front surface and the rear surface may be opposed to each other in the third direction DR3, and the normal direction of each of the front surface and the rear surface may be parallel to the third direction DR3. The separation distance between the front surface and the rear surface in the third direction DR3 may correspond to the thickness of the member (or the unit). In the present specification, the expression "on a plane" may correspond to a state when viewed in the third direction DR3

(e.g., in a plan view). Meanwhile, directions indicated by the first to third directions DR1, DR2, and DR3 are relative concepts, and may be converted to different directions.

The display device DD of embodiments of the present disclosure may include a display region AA-DD and a non-display region NAA-DD. The display region AA-DD of the display device DD may be a region on which the image IM is displayed. The display region AA-DD of the display device DD may correspond to an active region AA of a display module DM, which will be described later.

In the present specification, the expression "region/part corresponds to another region/part" may refer to regions/parts that overlap each other, and is not limited to the case where the regions/parts have the same shape and area.

The display region AA-DD may have a square shape that is parallel to the plane defined by the first direction DR1 and the second direction DR2. However, this is merely an example, the display region AA-DD may be a flat shape having various shapes such as a circular shape or a polygonal shape, or a curved shape or a three-dimensional shape not limited to the flat shape, and is not limited to any one embodiment.

The non-display region NAA-DD is a region that blocks light and may be disposed outside the display region AA-DD. For example, the non-display region NAA-DD may surround the display region AA-DD. The non-display region NAA-DD of the display device DD may correspond to a peripheral region NAA of the display module DM, which will be described later. The shape of the non-display region NAA-DD is not limited to that shown in FIG. 1A and may be variously modified. For example, the non-display region NAA-DD may be disposed on the side surface of the display device DD not the front surface, or be adjacent to only one side of the display region AA-DD, but is not limited thereto, and may be omitted.

A sensing region SA-DD may be defined within the display region AA-DD of the display device DD. The sensing region SA-DD may correspond to a region, in which an electronic module EM overlaps, on a plane. The electronic module EM may receive an external input transmitted through the sensing region SA-DD and/or may provide an output for the outside through the sensing region SA-DD. FIG. 1A illustrates an embodiment having a single sensing region SA-DD, but the number of the sensing regions SA-DD is not limited thereto. In addition, embodiments of the present disclosure are not limited, and in some embodiments, the electronic module EM may overlap the non-display region NAA-DD.

In some embodiments, the display device DD may be flexible. The term "flexible" refers to a property that can be bent, and may include everything from a fully folded structure to a structure that can be bent at a level of several nanometers. For example, the flexible display device DD may include a curved display device or a foldable display device. Meanwhile, embodiments of the present disclosure are not limited thereto, and the display device DD may be rigid.

Referring to FIGS. 1A and 1B, the display device DD may include a window WP and a housing HU. The window WP and the housing HU may be coupled to define an outer appearance of the display device DD and provide an internal space which may accommodate components of the display device DD. The display device DD may include a display module DM, an anti-reflection member ARP, and the electronic module EM which are disposed between the window WP and the housing HU.

The electronic module EM may be disposed below the display module DM. The electronic module EM may be an electronic part which outputs and/or receives a light signal. For example, the electronic module EM may be a camera module for capturing an external image. Embodiment of the present disclosure are not limited thereto, and the electronic module EM may be a sensor module such as a proximity sensor or an infrared light-emitting sensor.

The display module DM may be disposed on the electronic module EM. The display module DM may display an image according to an electrical signal and transmit and receive information on an external input.

The display module DM may include the active region AA and the peripheral region NAA adjacent to the active region AA. The active region AA may be a region that is activated according to an electrical signal. The peripheral region NAA may be disposed outside the active region AA. For example, the peripheral area NAA may surround the active region AA. In the peripheral region NAA, a drive circuit or a drive wiring for driving the active region AA, and/or various suitable signal lines or pads for providing electrical signals to the active region AA may be disposed.

A hole HH and a margin region MA may be defined within the active region AA of the display module DM. The margin region MA may be a region defined by surrounding the hole HH and a region in which light emitting elements, which will be described later, do not overlap. The hole HH may be defined to penetrate at least one portion of the display module DM within the margin region MA. The hole HH may overlap the sensing region SA-DD of FIG. 1A. A portion of the electronic module EM may be inserted into the hole HH.

Meanwhile, an embodiment in which the hole HH passing through the display module DM is defined in the margin region MA is illustrated in FIG. 1B, but embodiments of the present disclosure are not limited thereto, and in some embodiments, the hole HH may not be defined in the margin region MA. Accordingly, the margin region MA may overlap the light emitting elements and the electronic module EM on a plane. Accordingly, the display panel of the display module DM may overlap the electronic module EM without having a penetrated portion. In this case, the density of the light emitting elements disposed in the margin region MA may be smaller than that of the light emitting elements disposed in the active region AA.

The anti-reflection member ARP may be disposed between the display module DM and the window WP. The anti-reflection member ARP may reduce the reflection of light incident from the outside of the display device DD. That is, the anti-reflection member ARP may reduce the external light reflection rate of the display device DD. The anti-reflection member ARP of an embodiment may include a light shielding pattern and a plurality of color filters which will be described later. The anti-reflection member ARP may include a through hole passing through the anti-reflection member ARP to correspond to the hole HH. However, embodiments of the present disclosure are not limited thereto, and the anti-reflection member ARP may overlap the hole HH.

The window WP may be disposed on the display module DM and the anti-reflection member ARP. The window WP may transmit an image provided by the display module DM and a user may view the image through the window WP. The window WP may protect internal components of the display device DD against an external impact. For example, the window WP may protect the display module DM and the anti-reflection member ARP which are disposed below the window WP.

The window WP may include an upper surface FS exposed to the outside. The upper surface FS of the window WP may correspond to the front surface of the display device DD. The upper surface FS of the window WP may include a transmission region TA and a bezel region BZA.

The transmission region TA may be an optically transparent region. The transmission region TA may overlap at least a portion of the active region AA of the display module DM. The image displayed on the active region AA of the display module DM may be viewed from the outside through the transmission region TA.

The sensing region SA may be defined in the transmission region TA of the window WP. The sensing region SA of the window WP may correspond to the sensing region SA-DD of the display device DD.

The bezel region BZA of the window WP may be adjacent to the transmission region TA, and surround the transmission region TA. The bezel region BZA may be a region having a set or predetermined color. The bezel region BZA may overlap at least a portion of the peripheral region NAA of the display module DM. The bezel region BZA may cover the peripheral region NAA of the display module DM to prevent the peripheral region NAA from being viewed from the outside.

The housing HU may be disposed below the display module DM. The housing HU may protect components accommodated in the housing HU. The housing HU may absorb impacts applied from the outside and prevent foreign substances/moisture from penetrating into the display module DM. The housing HU may include a plurality of storage members that are combined together.

FIGS. 2A and 2B illustrate cross-sections of the display device DD according to various embodiments of the present disclosure. The same as described above may be applied to the components of the display device DD illustrated in FIGS. 2A and 2B.

Referring to FIGS. 2A and 2B, the display module DM may include a display panel DP and an input sensing layer ISL.

The display panel DP according to some embodiments may be a light emitting display panel, but embodiments of the present disclosure are not limited thereto. For example, the display panel DP may be an organic light emitting display panel, an inorganic light emitting display panel, or a quantum dot light emitting display panel. An emission layer of the organic light emitting display panel may include an organic light emitting material and an emission layer of the inorganic light emitting display panel may include an inorganic light emitting material. The quantum dot light emitting display panel may include a light emitting layer containing a quantum dot or a quantum rod. Hereinafter, the display panel DP is described as an organic light emitting display panel.

The input sensing layer ISL may be directly disposed on the display panel DP. In the present specification, where no separate adhesive layers or adhesive members are disposed and the components are formed by a continuous process may be expressed as "directly disposed." The expression "the input sensing layer ISL is directly disposed on the display panel DP" may indicate that "after the display panel DP is formed, the input sensing layer ISL is formed on a base surface provided by the display panel DP without a separate adhesive layer through a continuous process." Meanwhile, embodiments of the present disclosure are not limited thereto, and the input sensing layer ISL may be produced by a separate process from the display panel DP, and then may be fixed on the upper surface of the display panel DP via an adhesive layer.

The input sensing layer ISL may detect an external input applied from the outside of the display device DD. The input sensing layer ISL may obtain coordinate information of an external input. The external input may include various types of inputs such as a portion of a user's body, light, heat, or pressure. The input sensing layer ISL may be composed of a sensor operated in various methods such as an electrostatic capacitance method, a resistive film method, an infrared method, an acoustic wave method, or a pressure method, but is not limited to any one.

Referring to FIG. 2A, the window WP of some embodiments may include a base substrate WP-BS and a bezel pattern WP-BZ. Meanwhile, the window WP of FIG. 2B is simply illustrated without distinguishing the base substrate WP-BS and the bezel pattern WP-BZ.

The base substrate WP-BS may be a substrate including an optically transparent insulating material. The base substrate WP-BS may include at least one of a glass substrate or a synthetic resin film. The base substrate WP-BS may have a single layer structure or a multilayer structure.

The bezel pattern WP-BZ may be a color layer printed or deposited on one surface of the base substrate WP-BS. The bezel pattern WP-BZ may have a single layer structure or a multilayer structure. The bezel pattern WP-BZ having the multilayer structure may include a chromatic color layer and an achromatic color (particularly, black) light screening layer. The bezel pattern WP-BZ may be formed by a depositing, printing, or coating process. A region in which the bezel pattern WP-BZ is disposed may substantially correspond to the bezel region BZA of the window WP.

Meanwhile, the window WP may further include a functional coating layer disposed on the front surface of the base substrate WP-BS. The functional coating layer may include at least one of an anti-fingerprint layer, an anti-reflection layer, or a hard coating layer.

Referring to FIG. 2A, the window WP and the anti-reflection member ARP may be coupled with the components disposed below via the adhesive layer AF, respectively. The window WP may adhere to the anti-reflection member ARP via the adhesive layer AF. The anti-reflection member ARP may adhere to the display module DM via the adhesive layer AF. The adhesive layer AF may include a clear adhesive such as an optically clear adhesive film (OCA), an optically clear resin (OCR), or a pressure sensitive adhesive film (PSA).

However, embodiments of the present disclosure are not limited thereto, as illustrated in FIG. 2B, the anti-reflection member ARP may be directly disposed on the display module DM. In some embodiments, the anti-reflection member ARP may be directly disposed on the input sensing layer ISL. The anti-reflection member ARP may be formed by applying (or printing) a composition on a base surface provided by the input sensing layer ISL and then patterning.

Figure 3:
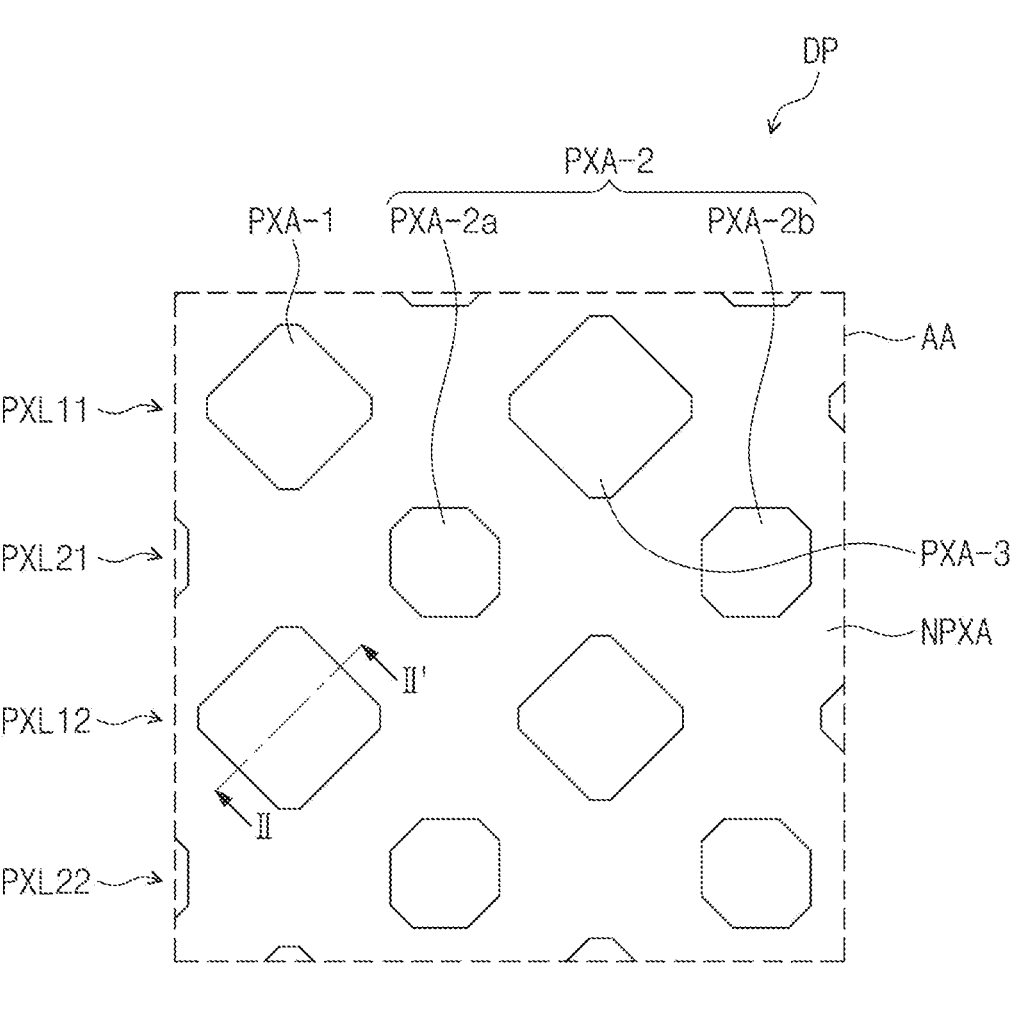
FIG. 3 is a plan view of a display panel according to an embodiment of the present disclosure.

FIG. 3 is a plan view of an active region of a display panel according to an embodiment. Referring to FIG. 3, the display panel DP may include a plurality of light emitting regions PXA and a non-light emitting region NPXA disposed in the active region AA.

Meanwhile, in the present specification, a first cross direction DR1a and a second cross direction DR2a crossing each of the first direction DR1 and the second direction DR2 may be defined. The angle between the first cross direction DR1a and the first direction DR1 and the angle between the first cross direction DR1a and the second direction DR2 may be acute angles. The first cross direction DR1a and the second cross direction DR2a may be orthogonal to each other.

The non-light emitting region NPXA may be disposed to be adjacent to the plurality of light emitting regions PXA. The non-light emitting region NPXA may surround the plurality of light emitting regions PXA and define a boundary between the plurality of light emitting regions PXA. The non-light emitting region NPXA may prevent color mixing of the lights emitted from the plurality of light emitting regions PXA. The non-light emitting region NPXA may correspond to a region in which a pixel defining film PDL, which will be described later, is disposed.

The plurality of light emitting regions PXA may include first light emitting regions PXA-1, second light emitting regions PXA-2, and third light emitting regions PXA-3. The first to third light emitting regions PXA-1, PXA-2, and PXA-3 may be regions that emit different color lights. Specifically, the first light emitting regions PXA-1 may be regions that emit light of a first color. The second light emitting regions PXA-2 may be regions that emit light of a second color. The third light emitting regions PXA-3 may be regions that emit light of a third color. For example, the first light emitting regions PXA-1 may emit a red light, the second light emitting regions PXA-2 may emit a green light, and the third light emitting regions PXA-3 may emit a blue light. However, embodiments of the present disclosure are not limited thereto, and the color lights emitted from the first to third light emitting regions PXA-1, PXA-2, and PXA-3 may be selected in a combination of three color lights to generate a white light by a mixture of the color lights. Alternatively, the first to third light emitting regions PXA-1, PXA-2, and PXA-3 may be regions that emit the same color lights.

The first light emitting regions PXA-1, the second light emitting regions PXA-2, and the third light emitting regions PXA-3 may be light emitting regions having different areas on a plane. For example, the area of the third light emitting regions PXA-3 among the plurality of light emitting regions PXA may be largest and the area of the second light emitting regions PXA-2 may be smallest. However, the configuration illustrated in FIG. 3 is merely an embodiment, but the embodiment is not limited thereto. For example, at least two selected out of the first light emitting region PXA-1, the second light emitting region PXA-2, and/or the third light emitting region PXA-3 may have the same area. The area of the light emitting regions PXA may be designed in consideration of light output efficiency of the color light emitted from the light emitting regions PXA.

The plurality of light emitting regions PXA may be arranged according to a set or predetermined rule. The light emitting regions arranged along the first direction DR1 may be defined as pixel rows PXL1 and PXL2. The pixel rows PXL1 and PXL2 may be divided into two groups.

First group pixel rows PXL1 may each be a pixel row in which the first light emitting regions PXA-1 and the third light emitting regions PXA-3 are alternately arranged along the first direction DR1. The first group pixel rows PXL1 may include a first pixel row PXL11 and a second pixel row PXL12. The first pixel row PXL11 and the second pixel row PXL12 may be alternately arranged along the second direction DR2.

The order of arrangement of the first and third light emitting regions PXA-1 and PXA-3 of the first pixel row PXL11 may be different from that of the first and third light emitting regions PXA-1 and PXA-3 of the second pixel row PXL12. Accordingly, the first light emitting region PXA-1 of the first pixel row PXL11 may be arranged in parallel to the third light emitting region PXA-3 of the second pixel row PXL12 in the second direction DR2.

Second group pixel rows PXL2 may each be a pixel row in which the second light emitting regions PXA-2 are arranged with each other along the first direction DR1. The second light emitting regions PXA-2 may be divided into two kinds of second light emitting regions PXA-2, the two kinds having have the same area but having symmetric shapes to each other. Hereinafter, the two kinds of second light emitting regions PXA-2 will be referred to as first kind regions PXA-2a and second kind regions PXA-2b, respectively.

The first kind regions PXA-2a may have the same shape as the second kind regions PXA-2b when the first kind regions PXA-2a rotates by an angle of 90 degrees on a plane (e.g., in a plan view). The second group pixel rows PXL2 may be pixel rows in which the first kind regions PXA-2a and the second kind regions PXA-2b are alternately arranged along the first direction DR1.

The second group pixel rows PXL2 may include a third pixel row PXL21 and a fourth pixel row PXL22. The third pixel row PXL21 and the fourth pixel row PXL22 may be alternately arranged along the second direction DR2. The order of arrangement of the first and second kind regions PXA-2a and PXA-2b of the third pixel row PXL21 may be different from that of the first and second kind regions PXA-2a and PXA-2b of the fourth pixel row PXL22. Accordingly, the first kind region PXA-2a of the third pixel row PXL21 may be arranged in parallel to the second kind region PXA-2b of the fourth pixel row PXL22 in the second direction DR2. However, embodiments of the present disclosure are not limited to the embodiment illustrated in FIG. 3, and the second light emitting regions PXA-2 may include only one kind of region that has the same area and shape of the light emitting region on a plane (e.g., in the plan view).

The first group pixel rows PXL1 and the second group pixel rows PXL2 may be alternately arranged along the second direction DR2. For example, as illustrated in FIG. 3, the first pixel row PXL11, the third pixel row PXL21, the second pixel row PXL12, and the fourth pixel row PXL22 may be sequentially arranged along the second direction DR2. The first light emitting regions PXA-1 of the first pixel row PXL11 and the second pixel row PXL12 and the first kind regions PXA-2a of the third pixel row PXL21 and the fourth pixel row PXL22 may be alternately arranged along the first cross direction DR1a.

FIG. 3 illustrates an arrangement of the plurality of light emitting regions PXA according to an embodiment, and the shape and arrangement of the plurality of light emitting regions PXA are not limited thereto.

Figure 4:
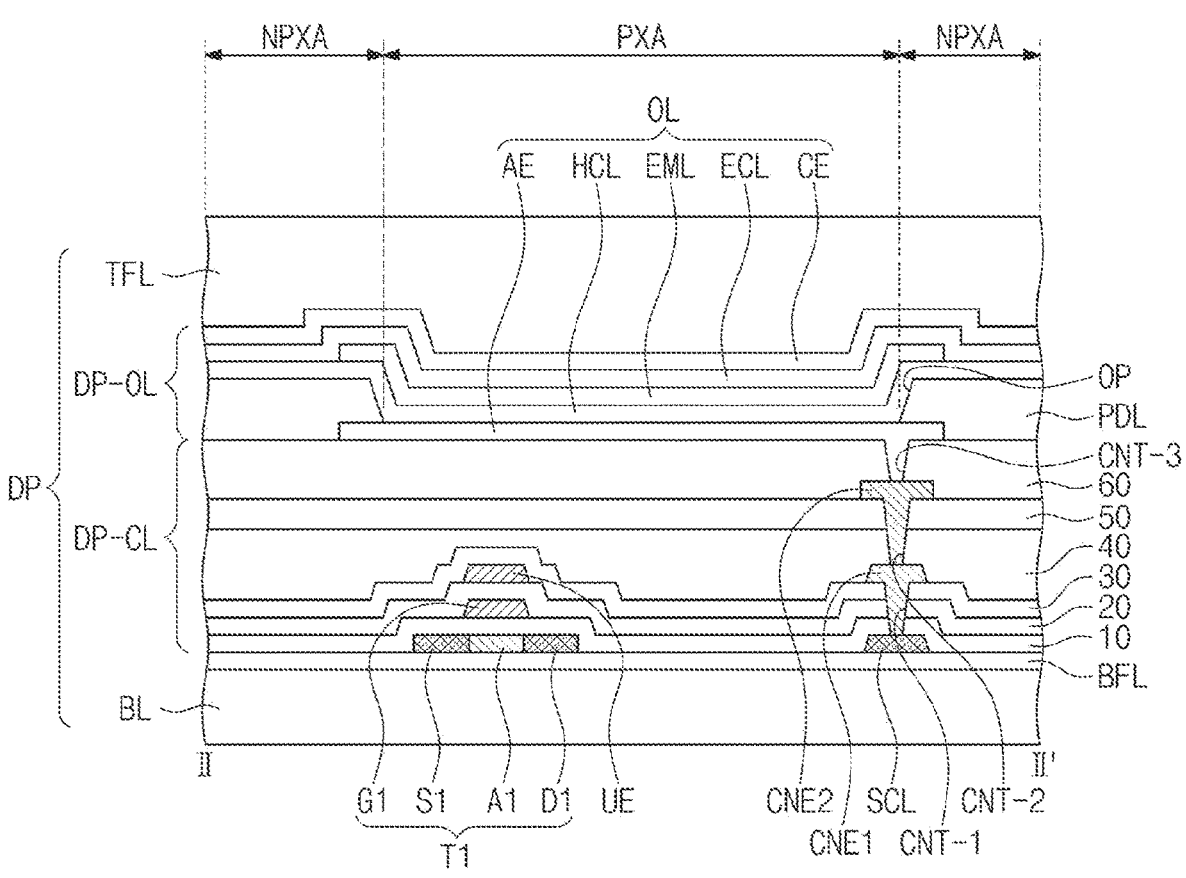
FIG. 4 is a cross-sectional view of a display panel according to an embodiment of the present disclosure taken along line II-II' of FIG. 3.

FIG. 4 illustrates a cross-sectional view of a display panel according to embodiments of the present disclosure taken along the line II-II' of FIG. 3. FIG. 4 illustrates the cross-section of the display panel DP corresponding to the third light emitting region PXA-3, but this may also be applied to the cross-sections corresponding to other light emitting regions. Hereinafter, in the description of the display panel DP which will be described below with reference to FIG. 4, the third light emitting region PXA-3 will be simply referred to as a light emitting region PXA.

Referring to FIG. 4, the display panel DP may include a base layer BL, a circuit element layer DP-CL, a display element layer DP-OL, and an encapsulation layer TFL. A stacked structure of the display panel DP is not limited to that illustrated in FIG. 4.

The display panel DP may include a plurality of insulating layers, a semiconductor pattern, a conductive pattern, signal lines, and the like. In the manufacturing of the display panel DP, the insulating layer, the semiconductor layer, and the conductive layer may be formed by a method such as coating or deposition, and then the insulating layer, the semiconductor layer, and the conductive layer may be selectively patterned by a photolithography method. Through this process, the semiconductor pattern, the conductive pattern, the signal line, etc. included in the display panel DP may be formed.

The semiconductor pattern may be arranged across pixels according to a predetermined rule. The pixels each may have an equivalent circuit including a plurality of transistors, at least one capacitor, and a light emitting element. The equivalent circuit diagram of the pixel may change into various forms according to various embodiments. FIG. 4 illustrates an embodiment that includes one transistor T1, a connection signal line SCL, and a light emitting element OL included in the pixel PXA.

The base layer BL may provide a base surface on which the circuit element layer DP-CL is disposed. The base layer BL may include a glass substrate, a metal substrate, a polymer substrate, and/or an organic/inorganic composite material substrate.

The base layer BL may have a multilayered structure. For example, the base layer BL may have a structure including synthetic resin layers and at least one inorganic layer disposed between the synthetic resin layers. The synthetic resin layer of the base layer BL may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, or a polyimide-based resin. However, the material of the base layer BL is not limited to the above example.

At least one inorganic layer may be disposed on an upper surface of the base layer BL. The inorganic layer may constitute a barrier layer and/or a buffer layer. FIG. 4 illustrates an embodiment in which a buffer layer BFL is disposed on the base layer BL. The buffer layer BFL may improve the bonding force between the base layer BL and the semiconductor pattern. The buffer layer BFL may include at least one of an aluminum oxide, a titanium oxide, a silicon oxide, a silicon nitride, a silicon oxynitride, a zirconium oxide, and/or a hafnium oxide.

The semiconductor pattern of the circuit element layer DP-CL may be disposed on the buffer layer BFL. FIG. 4 illustrates a portion of the semiconductor pattern, and the semiconductor pattern may be arranged according to a predetermined rule, overlapping the plurality of light emitting regions PXA (see FIG. 3) on a plane. The semiconductor pattern may include polysilicon. However, embodiments of the inventive concept are not limited thereto, and the semiconductor pattern may include amorphous silicon or a metal oxide.

The semiconductor pattern may differ in electrical properties depending on whether or not the semiconductor pattern is doped. The semiconductor pattern may include a first region having high conductivity and a second region having low conductivity. The first region may be doped with a N-type dopant or a P-type dopant. A P-type transistor may include a doped region that is doped with the P-type dopant and a N-type transistor may include a doped region that is doped with the N-type dopant. The second region may be a non-doped region or may be a region that is doped at a concentration less than that of the first region.

The first region may have conductivity greater than that of the second region and may substantially serve as an electrode or a signal line of the transistor. The second region may substantially correspond to an active region (or channel region) of the transistor. In other words, a portion of the semiconductor pattern may be an active region of the transistor, and the other portion may be a source region or a drain region of the transistor.

The circuit element layer DP-CL may include the transistor T1, the connection signal line SCL, and a plurality of insulating layers. A source region S1, an active region A1, and a drain region D1 of the transistor T1 may be formed from the semiconductor pattern. The connection signal line SCL may be formed from the semiconductor pattern, and may be disposed on the same layer as the source region S1, the active region A1, and the drain region D1 of the transistor T1. The connection signal line SCL may be electrically connected to the drain region D1 of the transistor T1 on a plane.

The plurality of insulating layers may be disposed on the buffer layer BFL. FIG. 4 illustrates first to sixth insulating layers 10 to 60 as an example of the plurality of insulating layers. Each of the first to sixth insulating layers 10 to 60 may be an inorganic layer and/or an organic layer. For example, the inorganic layer may include at least one of an aluminum oxide, a titanium oxide, a silicon oxide, a silicon nitride, a silicon oxynitride, a zirconium oxide, and/or a hafnium oxide.

The first insulating layer 10 may cover the semiconductor pattern of the circuit element layer DP-CL. A gate electrode G1 of the transistor T1 may be disposed on the first insulating layer 10. The gate electrode G1 may be a portion of the conductive pattern. The gate electrode G1 may overlap the active region A1. The gate electrode G1 may serve as a mask in the process of doping the semiconductor pattern.

The second insulating layer 20 may be disposed on the first insulating layer 10 to cover the gate electrode G1. An upper electrode UE may be disposed on the second insulating layer 20. The upper electrode UE may overlap the gate electrode G1.

The third insulating layer 30 may be disposed on the second insulating layer 20 to cover the upper electrode UE. A first connection electrode CNE1 may be disposed on the third insulating layer 30. The first connection electrode CNE1 may be connected to the connection signal line SCL through a contact hole CNT-1 passing through the first to third insulating layers 10, 20 and 30.

The fourth insulating layer 40 may be disposed on the third insulating layer 30. The fifth insulating layer 50 may be disposed on the fourth insulating layer 40. In some embodiments, the fourth insulating layer 40 and the fifth insulating layer 50 each may include an organic layer. The fourth insulating layer 40 and the fifth insulating layer 50 may provide a flat upper surface. The second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

The sixth insulating layer 60 may be disposed on the fifth insulating layer 50 to cover the second connection electrode CNE2. In some embodiments, the sixth insulating layer 60 may include an organic layer. The sixth insulating layer 60 may provide a flat upper surface.

The display element layer DP-OL may be disposed on the circuit element layer DP-CL. The display element layer DP-OL may include a plurality of light emitting elements OL and a pixel defining film PDL, and FIG. 4 illustrates a cross-section corresponding to one light emitting element OL among the plurality of light emitting elements OL. The light emitting element OL may include a first electrode AE, a hole control layer HCL, an emission layer EML, an electron control layer ECL, and a second electrode CE.

The first electrode AE may be disposed on the sixth insulating layer 60. The first electrode AE may be connected to the second connection electrode CNE2 through a contact hole CNT-3 passing through the sixth insulating layer 60.

The pixel defining film PDL may be disposed on the sixth insulating layer 60. In the pixel defining film PDL, a light emitting opening OP for exposing a portion of the first electrode AE may be defined. The pixel defining film PDL may cover the remaining portion other than the portion of the first electrode AE that is exposed by the light emitting opening OP. In this embodiment, the light emitting region PXA may correspond to the portion of the first electrode AE that is exposed by the light emitting opening OP. The non-light emitting region NPXA surrounding the light emitting region PXA may correspond to the region in which the pixel defining film PDL is disposed.

The pixel defining film PDL may include an organic material. The pixel defining film PDL of some embodiments may have a black color. For example, the pixel defining film PDL may include a base resin and a black pigment and/or a black dye mixed in the base resin.

The hole control layer HCL may be disposed on the first electrode AE. The hole control layer HCL may be disposed on the light emitting region PXA and the non-light emitting region NPXA in common. The hole control layer HCL may include at least one of a hole transport layer and/or a hole injection layer.

The emission layer EML may be disposed on the hole control layer HCL. The emission layer EML may be disposed on a region corresponding to the light emitting opening OP of the pixel defining layer PDL. The emission layer EML may include an organic light emitting material, an inorganic light emitting material, a quantum dot, a quantum rod, and/or one or more other suitable materials. The emission layers EML may be formed separately in each of the plurality of light emitting regions PXA (see FIG. 3). The separately formed emission layers EML each may emit at least one color of light selected from red, green, and/or blue. However, the embodiment of the inventive concept is not limited thereto, and the emission layer EML may be provided for the plurality of light emitting regions PXA (see FIG. 3) in common, and may emit a blue light or a white light.

The electron control layer ECL may be disposed on the emission layer EML. The electron control layer ECL may be disposed on the light emitting region PXA and the non-light emitting region NPXA in common. The electron control layer ECL may include at least one of an electron transport layer and/or an electron injection layer.

The second electrode CE may be disposed on the electron control layer ECL. The second electrode CE may be disposed on the light emitting region PXA and the non-light emitting region NPXA in common. The second electrode CE of the light emitting element OL has an integral shape, and may be commonly disposed on the plurality of pixels. The second electrode CE may be provided with a common voltage, and the second electrode CE may be referred as a common electrode.

The encapsulation layer TFL may be disposed on the display element layer DP-OL. The encapsulation layer TFL may include an inorganic film and an organic film. For example, the encapsulation layer TFL may include a plurality of inorganic films and an organic film disposed between the plurality of inorganic films. However, the structure constituting the encapsulation layer TFL is not limited thereto. The inorganic film may protect the display element layer DP-OL from moisture and/or oxygen. The organic film may protect the display element layer DP-OL from foreign substances such as dust particles.

Figure 5:
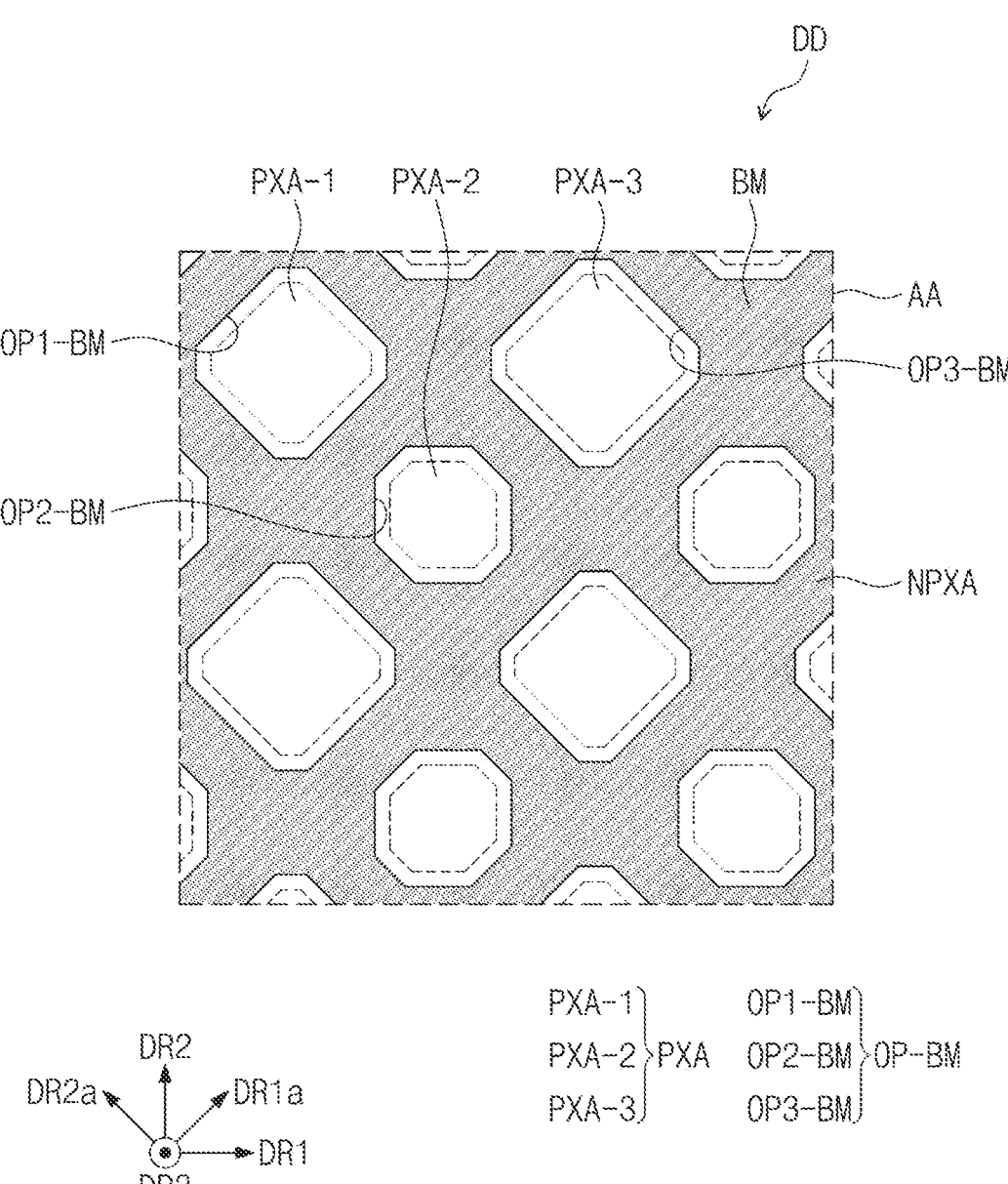
FIG. 5 is a plan view of a display device according to an embodiment of the present disclosure.

FIG. 5 is a plan view corresponding to an active region of a display device according to an embodiment. FIG. 5 illustrates a plan view of a light shielding pattern BM disposed to correspond to the plan view of the display panel DP illustrated in FIG. 3.

The light shielding pattern BM may be disposed on the display module DM (see FIGS. 2A and 2B). The light shielding pattern BM may have a black color and include a black coloring agent. For example, the light shielding pattern BM may include at least one of a black dye, a black pigment, a metal such as carbon black, chromium, and/or an oxide thereof.

A plurality of openings OP-BM may be defined in the light shielding pattern BM. The plurality of openings OP-BM may correspond to a plurality of light emitting regions PXA, respectively. That is, the plurality of openings OP-BM may correspond to the light emitting openings OP of the pixel defining film PDL, as described above, corresponding to the plurality of light emitting regions PXA.

The opening area of each of the plurality of openings OP-BM of the light shielding pattern BM may be equal to or greater than the area of the corresponding light emitting region PXA. FIG. 5 is an example to illustrate the plurality of openings OP-BM having an area greater than that of the corresponding light emitting region PXA.

The opening shape of each of the plurality of openings OP-BM of the light shielding pattern BM may be substantially equal to the shape of the corresponding light emitting region PXA. The plurality of openings OP-BM of the light shielding pattern BM may overlap the plurality of light emitting regions PXA on a plane (e.g., in a plan view), respectively, and each of the plurality of openings OP-BM may have a shape that is enlarged at a substantially uniform distance from the corresponding light emitting region PXA. However, embodiments of the present disclosure are not limited thereto, and each of the plurality of openings OP-BM of the light shielding pattern BM may have the same area and shape as the corresponding light emitting region PXA.

The plurality of openings OP-BM of the light shielding pattern BM may include first openings OP1-BM corresponding to the first light emitting regions PXA-1, respectively, second openings OP2-BM corresponding to the second light emitting regions PXA-2, respectively, and third openings OP3-BM corresponding to the third light emitting regions PXA-3, respectively.

The light shielding pattern BM may be directly formed on the input sensing layer ISL of FIG. 2B. The light shielding pattern BM may be produced by applying a base resin containing a black component on a base surface provided by the input sensing layer ISL to form a resin layer, and then forming, through a photolithography process, the plurality of openings OP-BM passing through the resin layer.

FIGS. 6A to 6D are plan views corresponding to an active region of a display device according to an embodiment. FIGS. 6A to 6D illustrate a plurality of color filters CF disposed on the light shielding pattern BM of FIG. 5. The plurality of color filters CF illustrated in FIGS. 6A to 6D have the substantially same components but have some differences in a disposed shape.

Figure 6A:
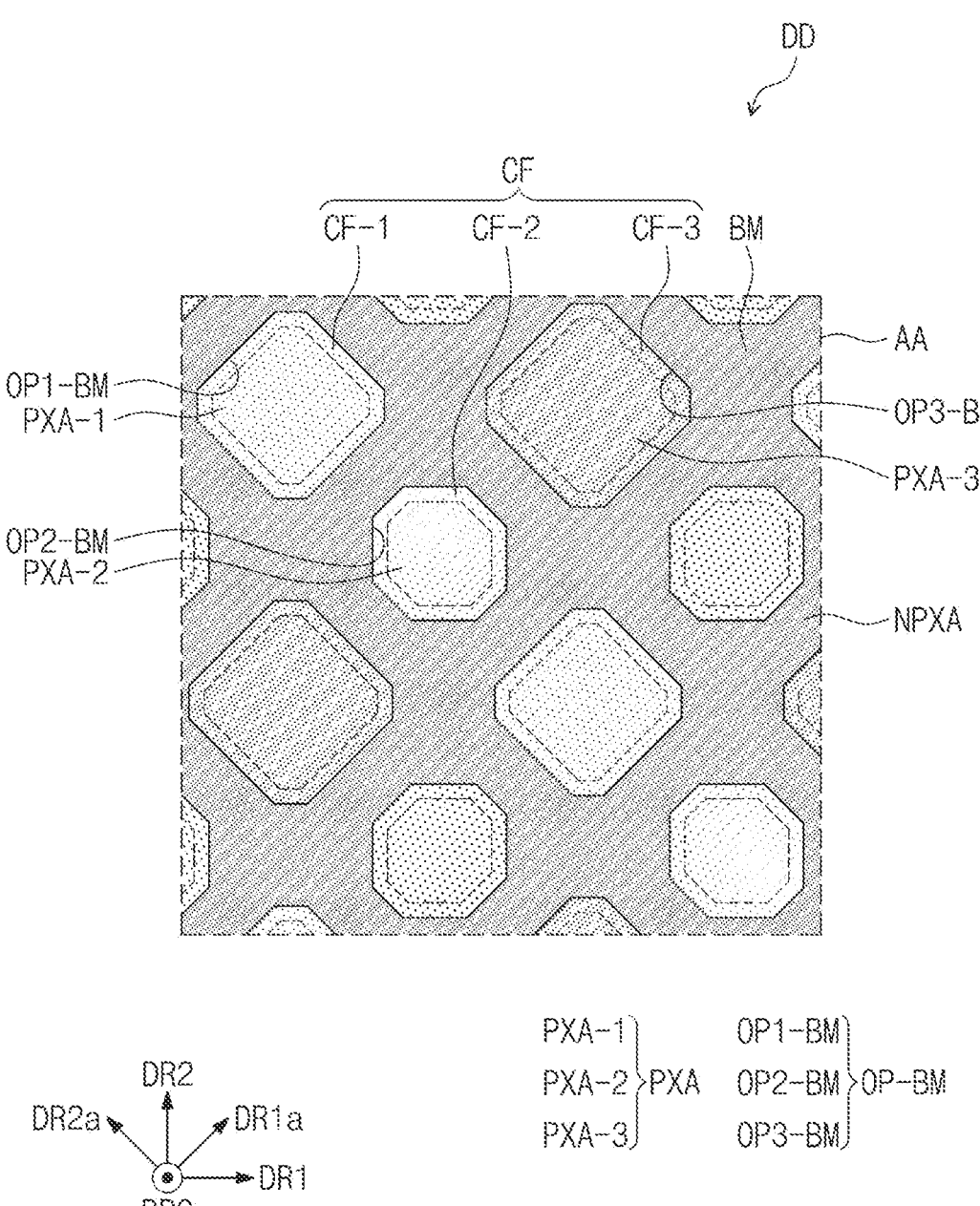
FIGS. 6A-6D are plan views of display devices according to embodiments of the present disclosure.

Referring to FIG. 6A, the plurality of color filters CF may be disposed to correspond to the plurality of light emitting regions PXA, respectively. The plurality of color filters CF may overlap the plurality of light emitting regions PXA, respectively, on a plane. The plurality of color filters CF may be disposed in the plurality of openings OP-BM to correspond to the plurality of openings OP-BM of the light shielding pattern BM, respectively. Thus, the plurality of color filters CF may be spaced apart from each other with the light shielding pattern BM interposed therebetween on a plane.

The plurality of color filters CF may include first color filters CF-1 corresponding to the first light emitting regions PXA-1, respectively, second color filters CF-2 corresponding to the second light emitting regions PXA-2, respectively, and third color filters CF-3 corresponding to the third light emitting regions PXA-3, respectively.

Each of the first to third color filters CF-1, CF-2, and CF-3 may include a base resin and a dye and/or a pigment dispersed in the base resin. The base resin is a medium in which the dye and/or pigment is dispersed, and may include various resin compositions that are generally referred to as binders.

In an embodiment of the inventive concept, at least one among the first to third color filters CF-1, CF-2, and CF-3 may be a color filter that transmits, at a high ratio, light in a wavelength region corresponding to a particular color light, and absorbs most of the remaining color lights. The first to third color filters CF-1, CF-2, and CF-3 may transmit, at a high ratio, the color light emitted from the light emitting regions PXA overlapping and corresponding to the first to third color filters CF-1, CF-2, and CF-3. Accordingly, the light output efficiency of the display device DD may be maintained at a predetermined value and the external light reflection rate of the display device DD may be reduced at the same time.

For example, the first color filters CF-1 may correspond to a red color filter that transmits a red light and absorbs most of a green light and a blue light. The second color filters CF-2 may correspond to a green color filter that transmits a green light and absorbs most of a red light and a blue light. The third color filters CF-3 may correspond to a blue color filter that transmits a blue light and absorbs most of a red light and a green light.

At least one among the first to third color filters CF-1, CF-2, and CF-3 may be a gray filter that may transmit, at a set or predetermined ratio, all lights in wavelength regions corresponding to particular color lights. In an embodiment of the inventive concept, the gray filter may transmit, at a predetermined ratio (e.g., about 50% to about 80%), lights in wavelength regions corresponding to the red light, the green light, and the blue light, respectively. The gray filter may transmit the red light, the green light, and the blue light at a ratio relatively lower than the ratio in which the red color filter, the green color filter, and the blue color filter transmit the red light, the green light, and the blue light, respectively.

For example, the green color filter may transmit about 90% or more of the green light and absorb most of the remaining red light and blue light while the gray filter may transmit the green light at a ratio (e.g., about 50% to about 80%) relatively lower than the green color filter. However, the gray filter may also transmit about 50% to about 80% of the red light and the blue light, most of which the green color filter absorbs. In contrast, the green color filter may absorb most of the red light and the blue light and transmit about 30% or less, and further, less than about 10%. However, the numerical examples of the ratio are merely illustrative, and not limited thereto.

The first to third color filters CF-1, CF-2, and CF-3 of an embodiment may include the gray filter and at least one of the red color filter, the green color filter, and/or the blue color filter. The first to third color filters CF-1, CF-2, and CF-3 of an embodiment may include the gray filter and two color filters of the red color filter, the green color filter, and/or the blue color filter. For example, the first color filter CF-1 and the third color filter CF-3 may be the red color filter and the blue color filter, respectively, and the second color filter CF-2 may be the gray filter. However, the embodiment of the inventive concept is not limited thereto, the first color filter CF-1 may be the gray filter, and the second color filter CF-2 and the third color filter CF-3 may be the green color filter and the blue color filter, respectively, or the third color filter CF-3 may be the gray filter, and the first color filter CF-1 and the second color filter CF-2 may be the red color filter and the green color filter, respectively.

When the color filters CF are continuously exposed to intense ultraviolet light, a portion of the materials included in the color filters may be denatured, and thus the brightness of the display device DD to a particular color may be reduced. However, the gray filter may be prevented from the deterioration or discoloration due to the external ultraviolet light. The display device DD includes the gray filter, and thus the external light reflection rate of the display device DD may be reduced and the brightness reduction phenomenon of the display device DD may be prevented at the same time. Thus, the anti-reflection member ARP of the inventive concept includes the gray filter and at least one of the red color filter, the green color filter, and/or the blue color filter, and thus the external light reflection rate of the display device DD may be reduced and the display device DD has a set or predetermined light output efficiency, and the brightness reduction issue of the display device DD with respect to a particular color may be prevented or improved at the same time.

In particular, when the green color filter disposed on the display module DM is exposed to ultraviolet light, some atoms of the material included in the green color filter may be separated. Accordingly, the green brightness of the display device DD may be reduced. However, when the gray filter is disposed to correspond to the light emitting element that emits a green light, the degeneration of the color filter due to ultraviolet light may be prevented and the external light reflection rate of the display device DD may be reduced at the same time. Accordingly, the display device DD maintains a set or predetermined light output efficiency and the issue in which the green brightness is reduced may be improved at the same time.

Natural light incident toward the display device DD may be reflected in the active region AA, and the reflected light may have set or predetermined properties. In particular, while the display device DD is off, a black reflected light may have a set or predetermined color quality according to the arrangement and area of the light emitting regions PXA and color filters CF, which are disposed in the active region AA. The anti-reflection member ARP of an embodiment includes the gray filter, and thus may prevent or protect the black reflected light from shifting to have a particular color quality. Accordingly, the color quality of the black reflected light may become closer to pure black.

Figure 6B:
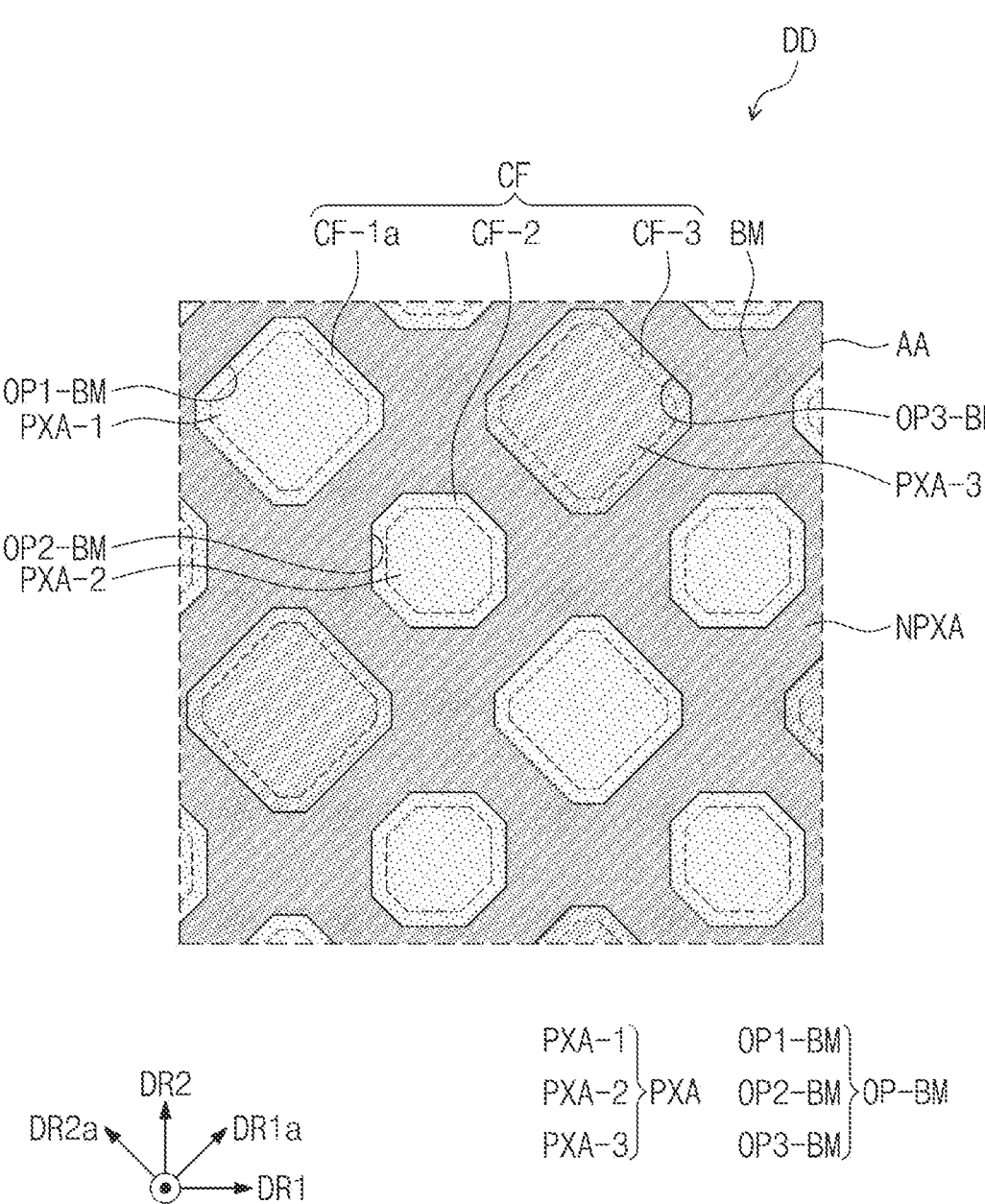

Referring to FIG. 6B, the first to third color filters CF-1a, CF-2, and CF-3 of an embodiment of the inventive concept may include the gray filter and one color filter among the red color filter, the green color filter, and/or the blue color filter. For example, the first color filter CF-1a and the second color filter CF-2 may be the gray filter, and the third color filter CF-3 may be the blue color filter. The first color filter CF-1a and the second color filter CF-2 may include the same material, and include a different material from the material included in the third color filter CF-3.

However, embodiments of the present disclosure are not limited thereto, and the second color filter CF-2 and the third color filter CF-3 may be the gray filter and the first color filter CF-1a may be the red color filter, or the first color filter CF-1a and the third color filter CF-3 may be the gray filter and the second color filter CF-2 may be the green color filter. For the display device DD of FIG. 6B having the area and number of the gray filters greater than those of the display device DD illustrated in FIG. 6A, the light output efficiency may be relatively reduced, but the degeneration of the color filter due to ultraviolet light and the brightness reduction issue may be improved.

Hereinafter, the above description with reference to FIGS. 6A and 6B may be equally applied to the description of a plurality of color filters CF which will be described later with reference to FIGS. 6C and 6D, and the plurality of color filters CF will be described on the basis of the embodiment in that the first color filters CF-1 are red color filters, the second color filters CF-2 are gray filters, and the third color filters CF-3 are blue color filters.

Figure 6C:
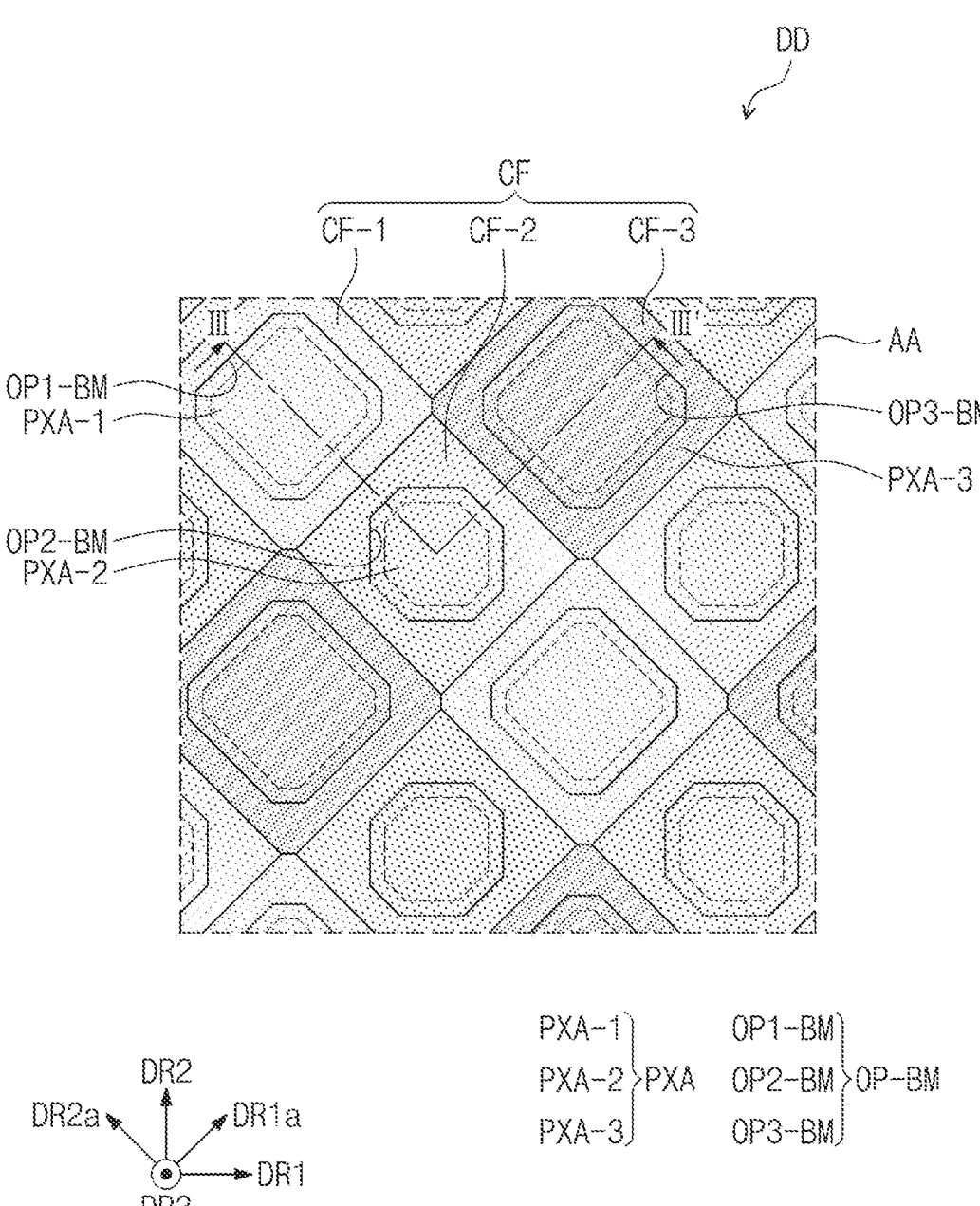
Figure 6D:
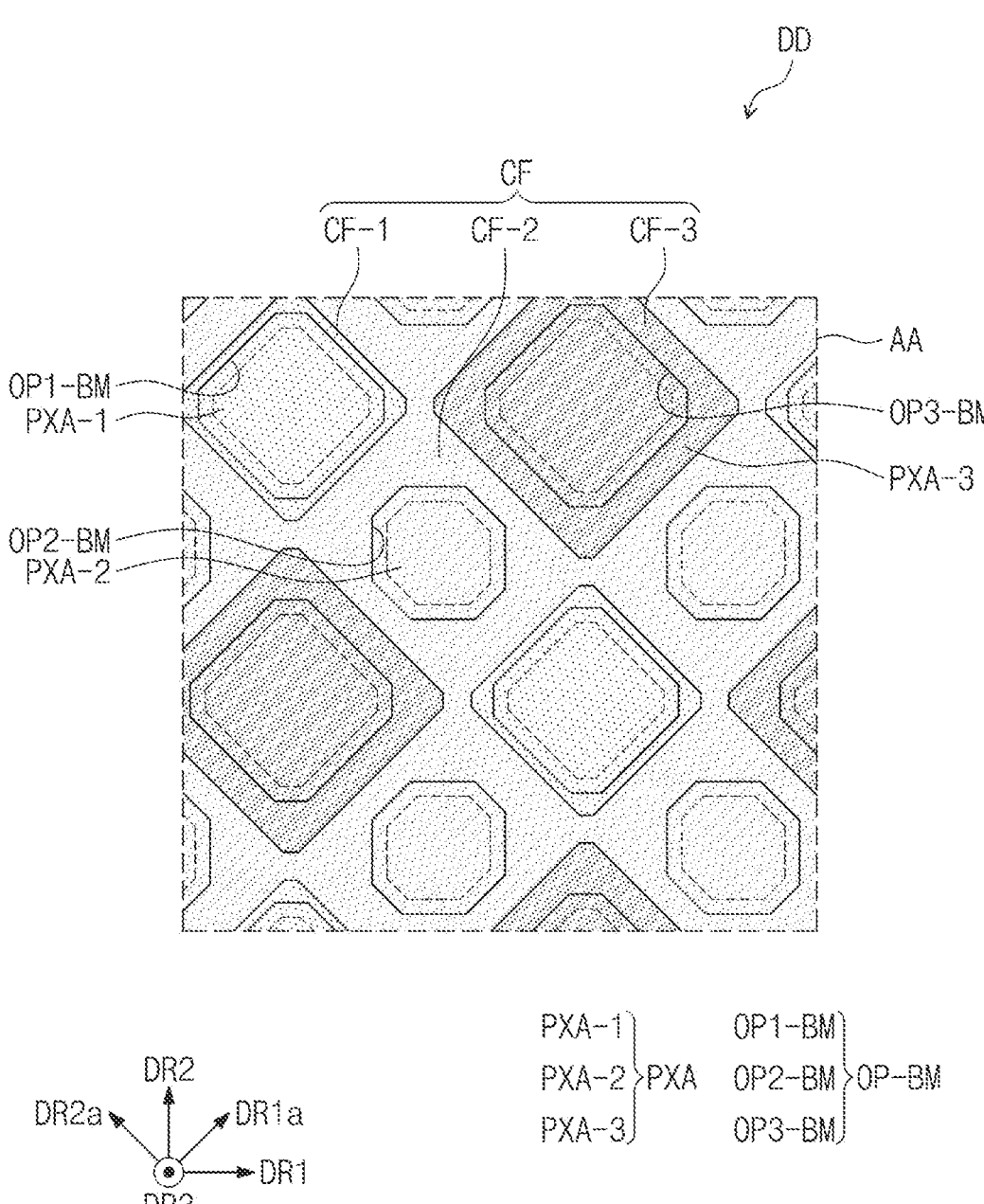

Referring to FIGS. 6C and 6D, the plurality of color filters CF may be disposed in the plurality of openings OP-BM of the light shielding pattern BM, and simultaneously overlap a portion on the light shielding pattern BM on a plane. That is, the plurality of color filters CF each may cover a portion of an upper surface of the light shielding pattern BM.

Referring to FIG. 6C, the plurality of color filters CF may be in contact with the boundaries of the adjacent color filters, respectively. However, the embodiment of the inventive concept is not limited thereto, and the plurality of color filters CF may have overlapped regions adjacent to the boundaries on a plane. For example, the second color filter CF-2 may be in contact with the adjacent first and third color filters CF-1 and CF-3 along the first cross direction DR1a and the second cross direction DR2a, and some portions may overlap each other on a plane.

The second color filters CF-2 composed of the gray filters may be spaced apart from each other with the first color filter CF-1 and the third color filter CF-3 interposed therebetween on a plane. The area of each of the first color filter CF-1 and the third color filter CF-3 which are exposed on a plane may be larger than that of the second color filter CF-2. The external light reflection rate and the light output efficiency may be adjusted according to the area where the first to third color filters CF-1, CF-2, and CF-3 are exposed.

The disposition form of the second color filters CF-2 composed of the gray filters is not limited thereto, and the second color filters CF-2 may be connected to each other on a plane as illustrated in FIG. 6D. The connected second color filters CF-2 may surround the first color filters CF-1 and the third color filters CF-3. Accordingly, the first color filters CF-1 and the third color filters CF-3 may be spaced apart from each other with the second color filters CF-2 interposed therebetween.

The color quality of the reflected light may be adjusted according to the area where the first to third color filters CF-1, CF-2, and CF-3 are exposed. The sum of the areas of the connected second color filters CF-2 of FIG. 6D may be larger than the sum of the areas of the spaced second color filters CF-2 of FIG. 6C. As the area of the second color filters CF-2 composed of the gray filters increases, the color quality of the black reflected light may become closer to pure black.

The embodiments illustrated in FIGS. 6A to 6D are merely illustrative, and the disposition form of the plurality of color filters CF may vary according to the design of the display device DD and is not limited to any one embodiment as long as the disposition form of the plurality of color filters CF may cover the plurality of light emitting regions PXA on a plane.

Figure 7:
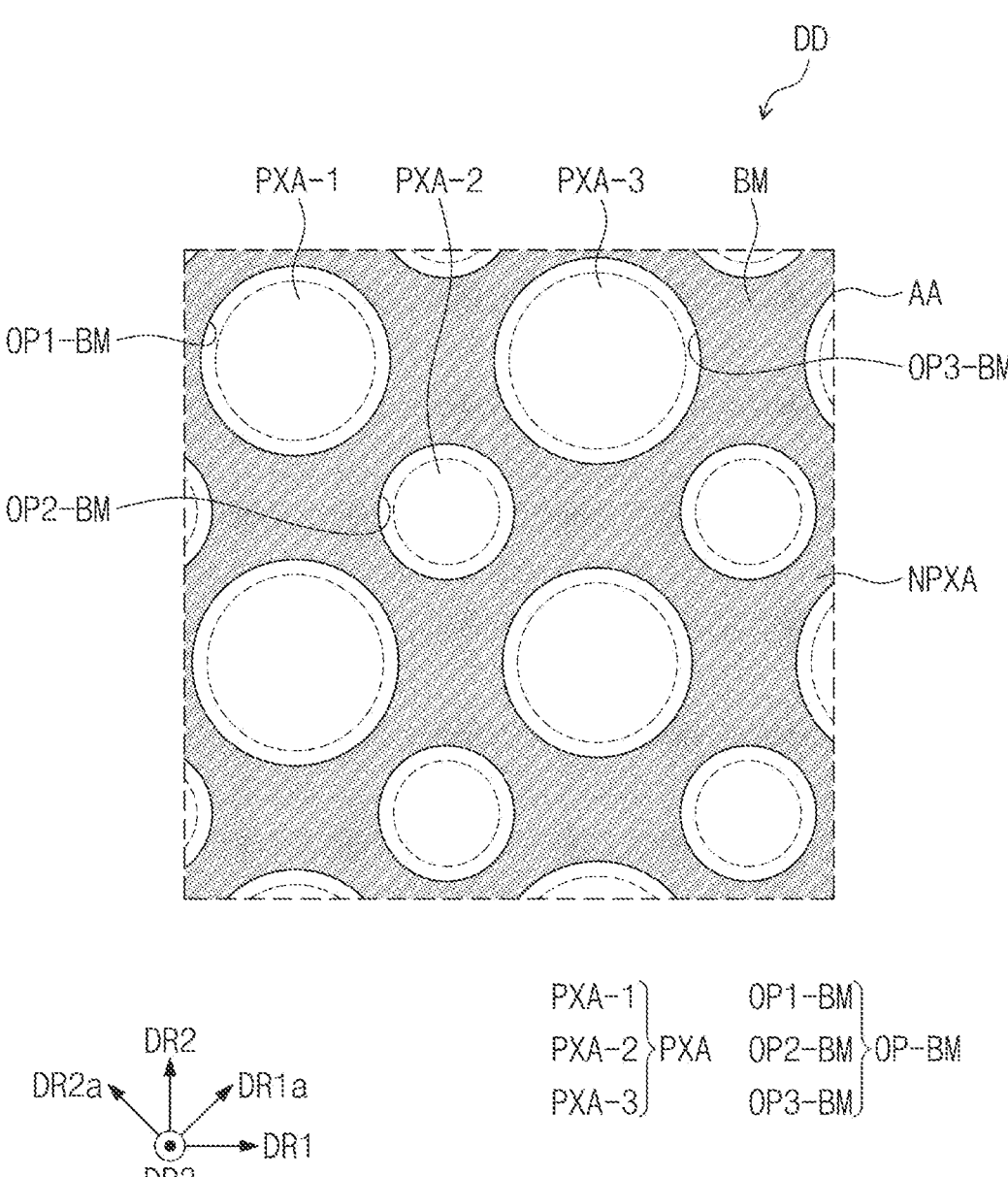
FIG. 7 is a plan view of a display device according to an embodiment of the present disclosure.

FIG. 7 is a plan view corresponding to an active region of a display device according to an embodiment. The above description may be equally applied to each component illustrated in FIG. 7. The light emitting regions PXA and openings OP-BM of the light shielding pattern BM illustrated in FIG. 7 are substantially equal to the embodiment illustrated in FIG. 5, but have some differences in a shape.

Referring to FIG. 7, each of the first light emitting regions PXA-1, the second light emitting regions PXA-2, and the third light emitting regions PXA-3 may have a circular shape on a plane. The first light emitting regions PXA-1, the second light emitting regions PXA-2, and the third light emitting regions PXA-3 may be circular regions having different areas. However, embodiments of the present disclosure are not limited thereto, at least some of the first light emitting regions PXA-1, the second light emitting regions PXA-2, and/or the third light emitting regions PXA-3 may be circular regions having the same area.

Each of the light emitting regions PXA may correspond to the first electrode AE of the light emitting element OL which is exposed by the light emitting opening OP (see FIG. 4) defined in the pixel defining film PDL (see FIG. 4). Thus, the light emitting opening OP (see FIG. 4) defined in the pixel defining film PDL (see FIG. 4) may have a circular shape on a plane.

The plurality of openings OP-BM of the light shielding pattern BM may include first openings OP1-BM corresponding to the first light emitting regions PXA-1, respectively, second openings OP2-BM corresponding to the second light emitting regions PXA-2, respectively, and third openings OP3-BM corresponding to the third light emitting regions PXA-3, respectively.

The opening area of each of the plurality of openings OP-BM of the light shielding pattern BM may be equal to or greater than the area of the corresponding light emitting region PXA. Thus, the opening area of each of the plurality of openings OP-BM of the light shielding pattern BM may be equal to or greater than the opening area of the corresponding light emitting opening OP (see FIG. 4) of the pixel defining film PDL (see FIG. 4).

The opening shape of each of the plurality of openings OP-BM of the light shielding pattern BM may have the same circular shape as the shape of the corresponding light emitting region PXA on a plane (e.g., in a plan view). In an embodiment, the plurality of openings OP-BM of the light shielding pattern BM may have a circular shape that is enlarged at a substantially uniform distance from the corresponding circular light emitting region PXA on a plane (e.g., in the plan view).

FIGS. 8A to 8D are plan views corresponding to an active region of a display device according to an embodiment. FIGS. 8A to 8D illustrate the plurality of color filters CF disposed on the light shielding pattern BM of FIG. 7. The above description may be equally applied to the plurality of color filters CF, and FIGS. 8A to 8D illustrates various embodiments according to the disposition of color filters CF.

Figure 8A:
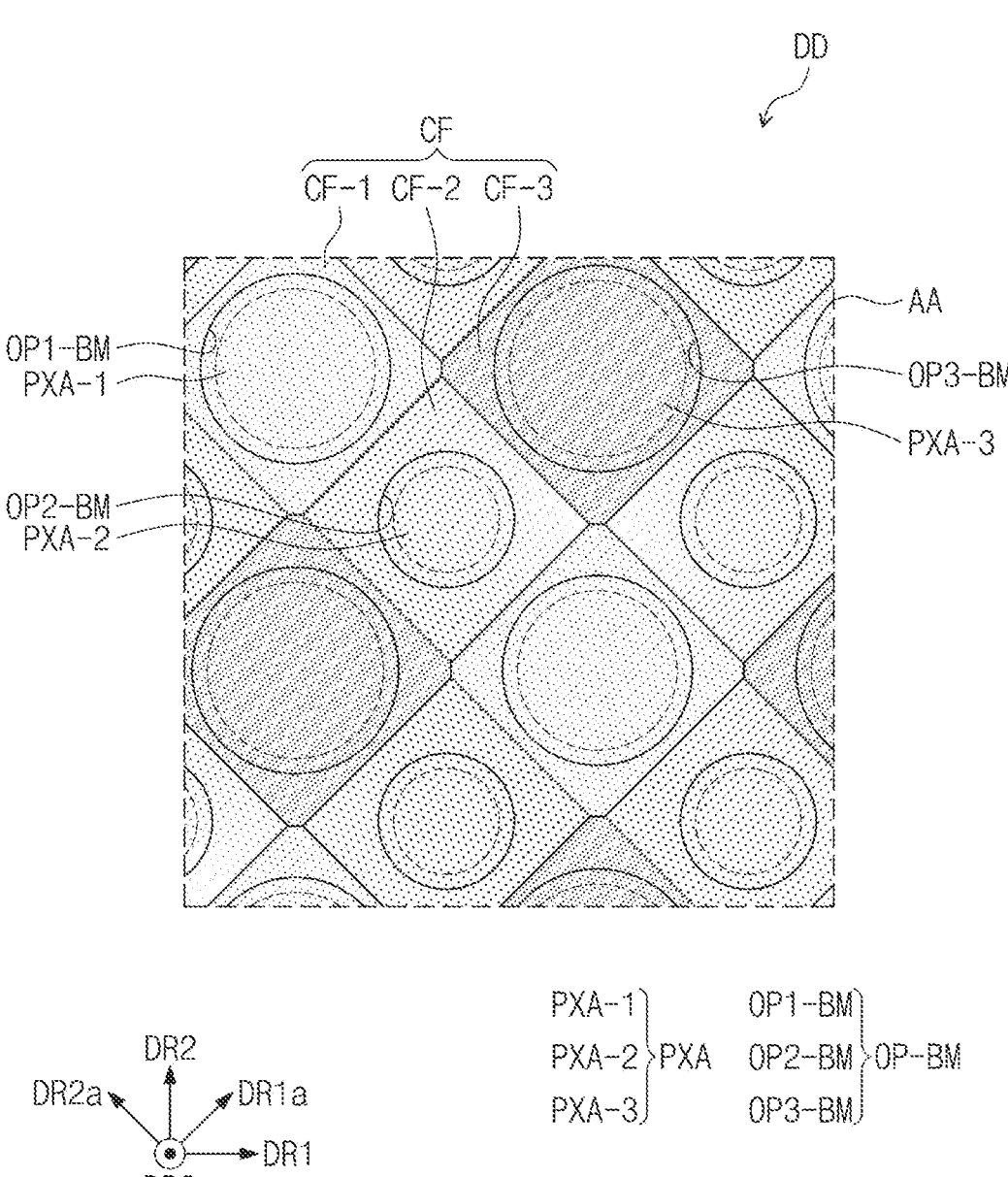
FIGS. 8A-8D are plan views of display devices according to embodiments of the present disclosure.

Referring to FIG. 8A, the plurality of color filters CF may be disposed to overlap the plurality of light emitting regions PXA on a plane, respectively. The plurality of color filters CF may be disposed in the plurality of openings OP-BM of the light shielding pattern BM, and simultaneously cover a portion on the light shielding pattern BM on a plane (e.g., in the plan view). The plurality of color filters CF each may be in contact with the boundaries of the adjacent color filters, or not limited thereto, regions adjacent to the boundaries may overlap each other.

First to third color filters CF-1, CF-2, and CF-3 of an embodiment may include the gray filter and two color filters of the red color filter, the green color filter, and/or the blue color filter. For example, the second color filter CF-2 may be the gray filter, and the first and third color filters CF-1 and CF-3 may be the red color filter and the blue color filter, respectively. However, the embodiment of the inventive concept is not limited thereto, the first color filter CF-1 may be the gray filter, and the second and third color filters CF-2 and CF-3 may be the green color filter and the blue color filter, respectively, or the third color filter CF-3 may be the gray filter, and the first and second color filters CF-1 and CF-2 may be the red color filter and the green color filter, respectively.

Figure 8B:
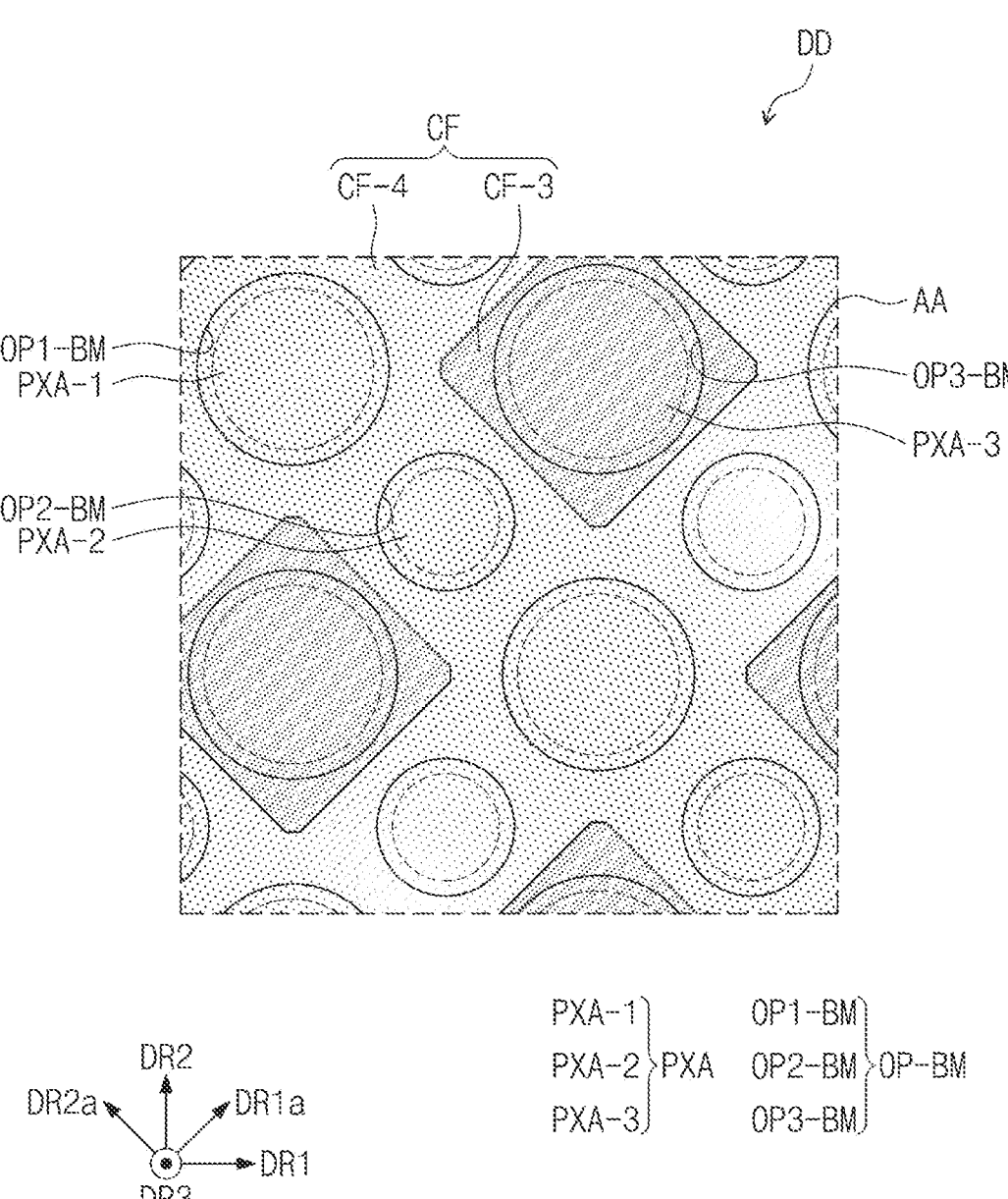
Figure 8C:
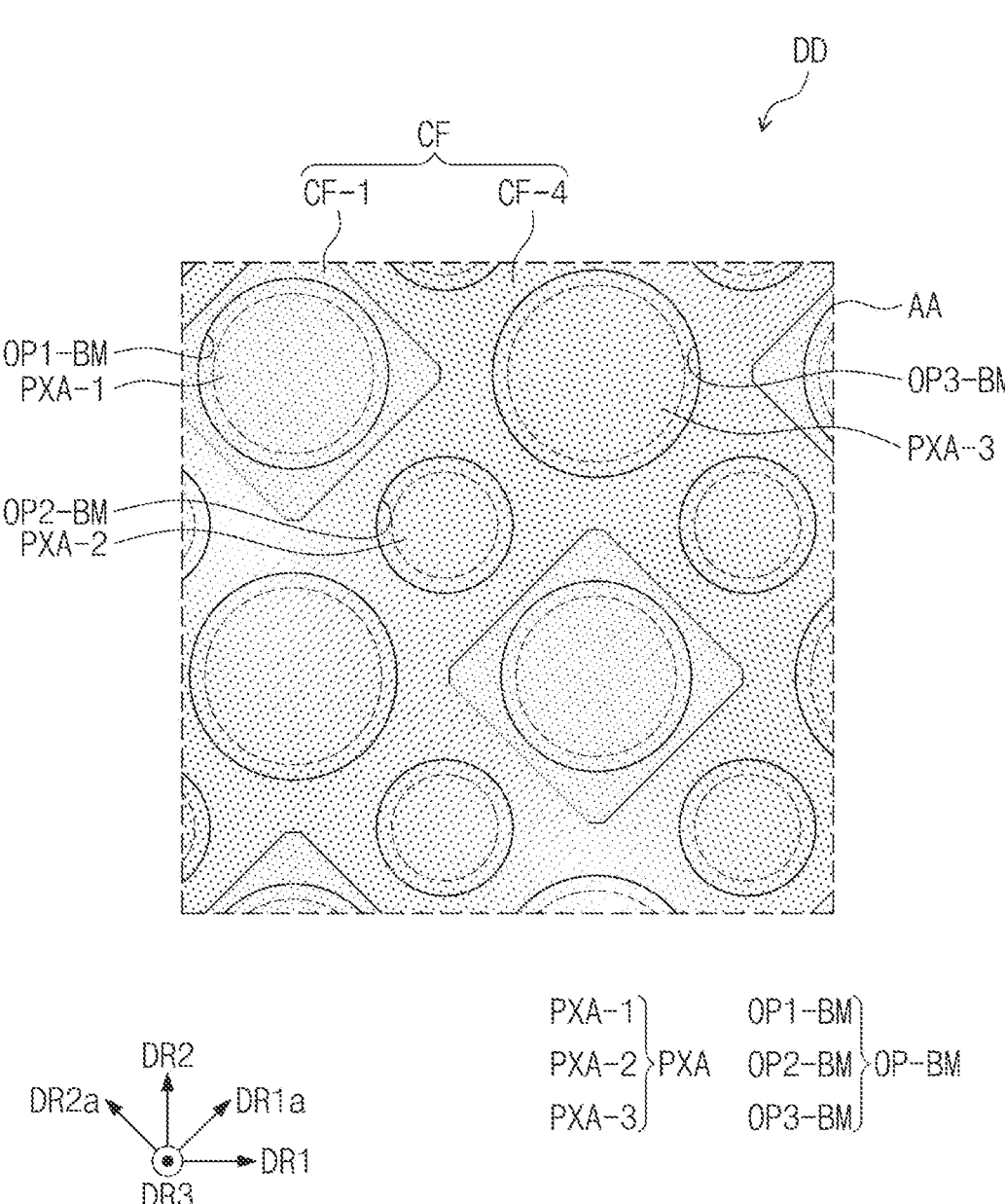
Figure 8D:
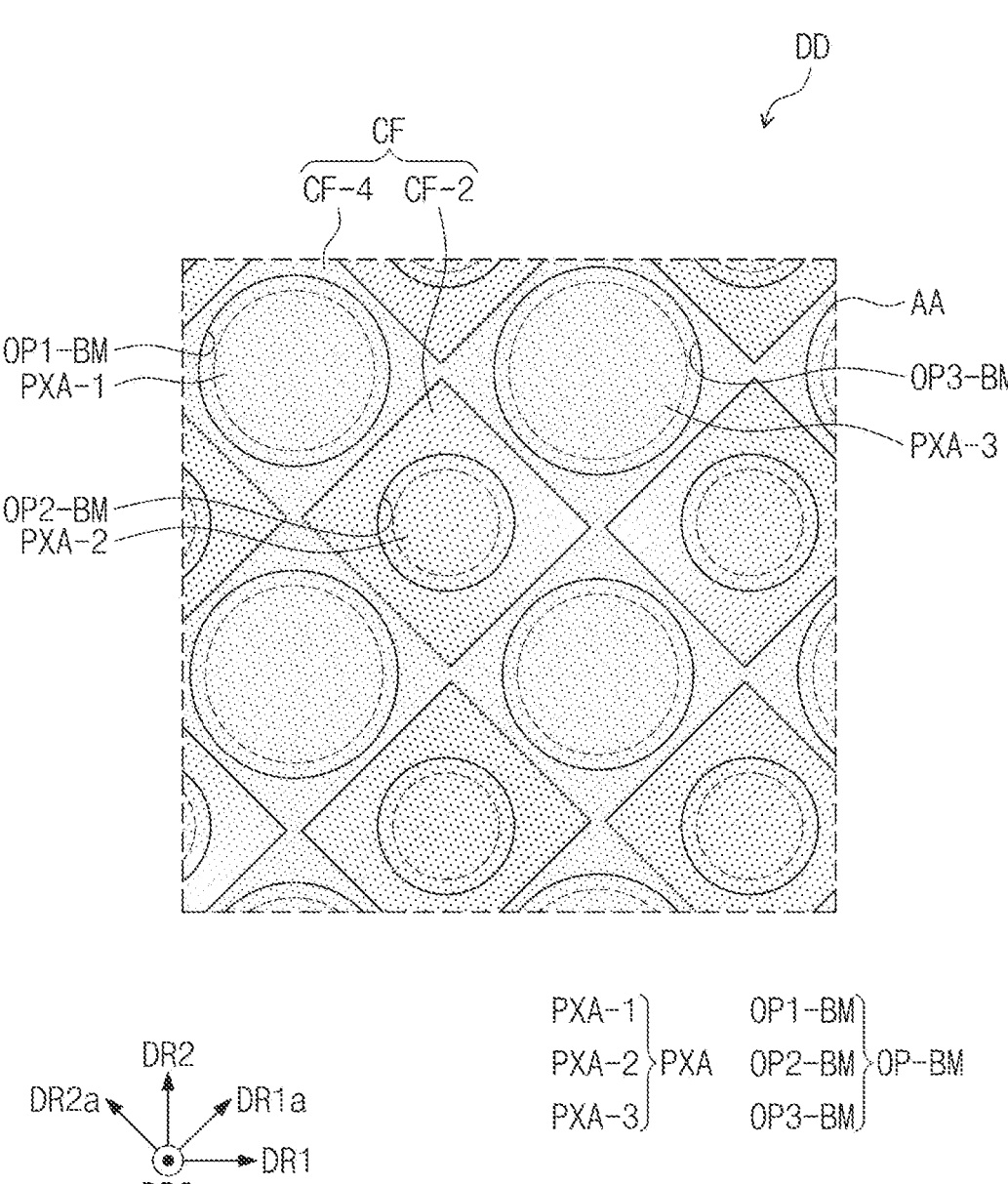

Referring to FIGS. 8B to 8D, the first to third color filters CF-1, CF-2, and CF-3 of an embodiment may include one color filter of the red color filter, the green color filter, and/or the blue color filter, and the remaining filters may be provided as the gray filter. The color filters among the first to third color filters CF-1, CF-2, and CF-3 provided as the gray filter may be integrally formed. Hereinafter, the color filter provided as the integrated gray filter is referred to as a gray filter CF-4.

Referring to FIG. 8B, the color filters CF-1 and the second color filters CF-2 of FIG. 8A may be provided as the gray filter CF-4 which is integrally formed. The gray filter CF-4 may overlap the first light emitting regions PXA-1 and the second light emitting regions PXA-2. The gray filter CF-4 may surround or be around the third color filters CF-3. Thus, the third color filters CF-3 may be spaced apart from each other with the gray filter CF-4 interposed therebetween. The third color filters CF-3 of an embodiment may be provided as the blue color filter.

Referring to FIG. 8C, the second color filters CF-2 and the third color filters CF-3 of FIG. 8A may be provided as the gray filter CF-4 which is integrally formed. The gray filter CF-4 may overlap the second light emitting regions PXA-2 and the third light emitting regions PXA-3. The gray filter CF-4 may surround or be around the first color filters CF-1, and the first color filters CF-1 may be spaced apart with the gray filter CF-4 interposed therebetween. The first color filters CF-1 of an embodiment may be provided as the red color filter.

Referring to FIG. 8D, the first color filters CF-1 and the third color filters CF-3 of FIG. 8A may be provided as the gray filter CF-4 which is integrally formed. The gray filter CF-4 may overlap the first light emitting regions PXA-1 and the third light emitting regions PXA-3. The gray filter CF-4 may surround or be around the second color filters CF-2, and the second color filters CF-2 may be spaced apart with the gray filter CF-4 interposed therebetween. However, the embodiment of the inventive concept is not limited thereto, the gray filter CF-4 overlapping the first light emitting region PXA-1 and the gray filter CF-4 overlapping the third light emitting region PXA-3 may be spaced apart from each other with the second color filter CF-2 interposed therebetween. The second color filters CF-2 of an embodiment may be provided as the green color filter.

The gray filter CF-4 of an embodiment may prevent or protect from the degeneration due to ultraviolet light and the external light reflection rate of the display device DD may be reduced at the same time. The color quality of the reflected light may be adjusted according to the area of the gray filter CF-4. As the area of the gray filter CF-4 increases, the color quality of the black reflected light may become closer to pure black.

Figure 9A:
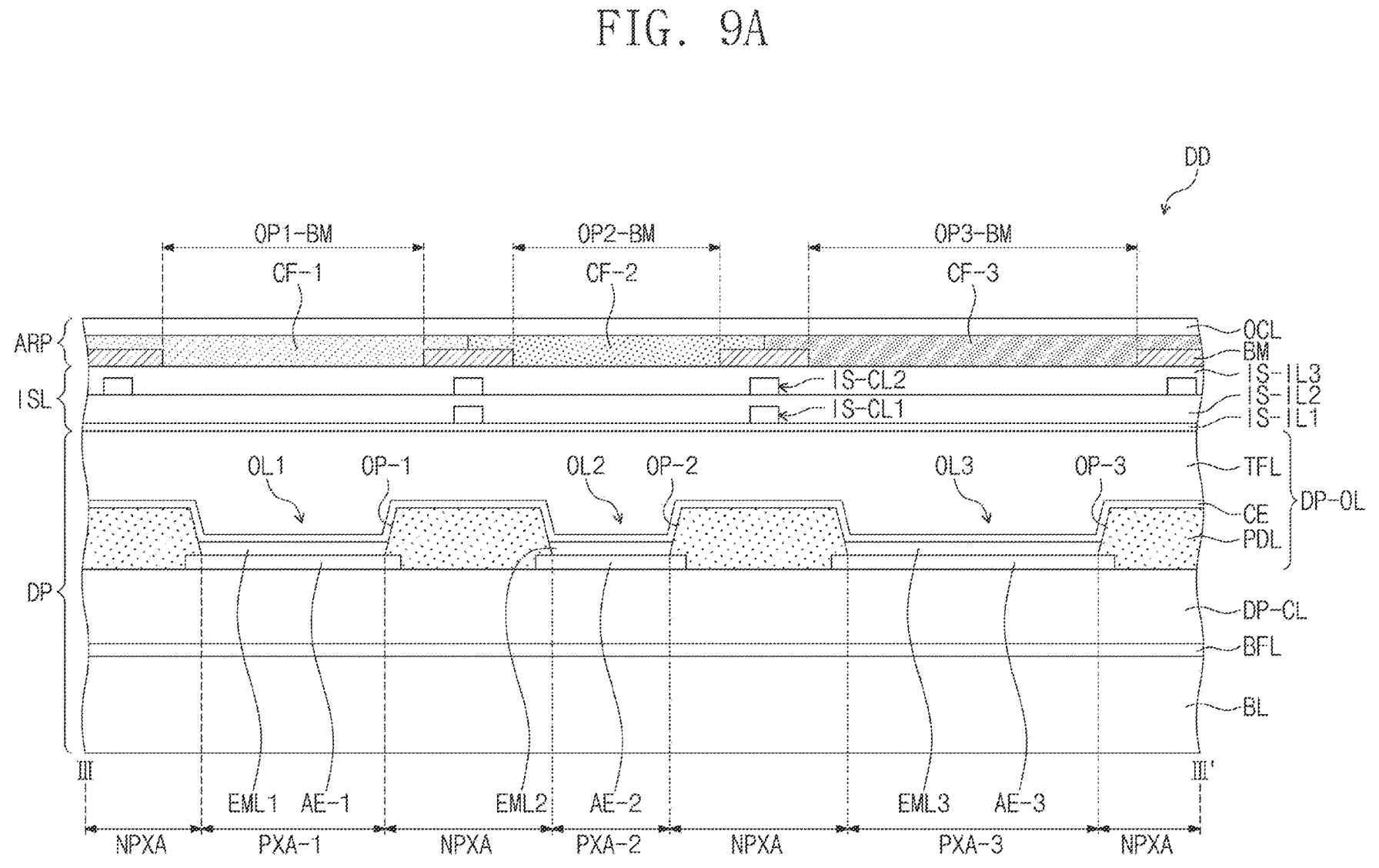
Figure 9B:
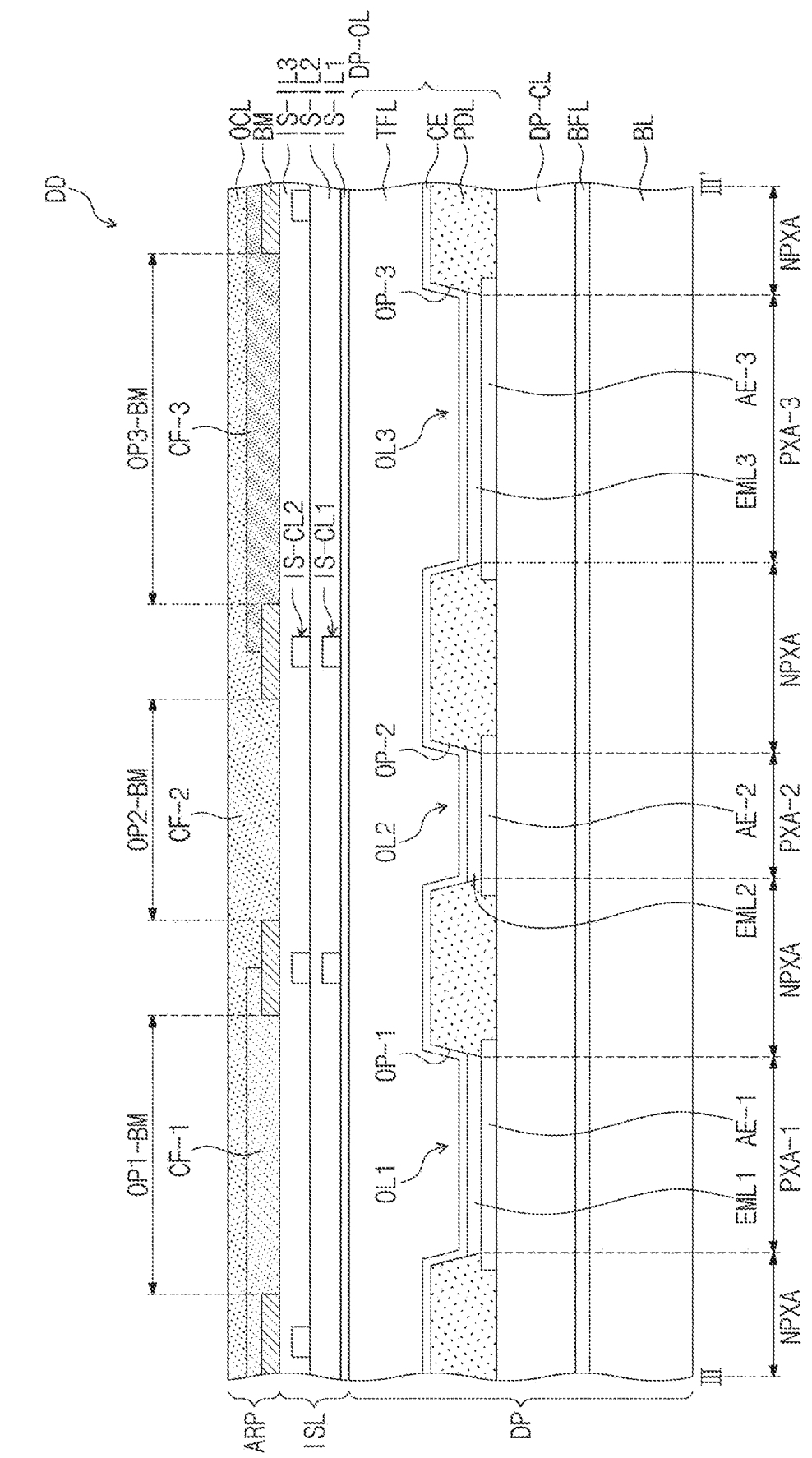

FIGS. 9A and 9B are cross-sectional views schematically illustrating cross-sections of display devices corresponding to those taken along the line III-Ill' illustrated in FIG. 6C. FIGS. 9A and 9B illustrates cross-sectional views of a plurality of light emitting elements OL1, OL2, and OL3 corresponding to the first to third light emitting regions PXA-1, PXA-2, and PXA-3.

The display devices DD illustrated in FIGS. 9A and 9B may include the substantially same components as each other and have a difference only in some compositions. The above description with reference to FIG. 4 may be equally applied to components of display panels DP.

Referring to FIGS. 9A and 9B, the display device DD of an embodiment may include the plurality of light emitting elements OL1, OL2, and OL3 disposed on a circuit element layer DP-CL. The plurality of light emitting elements OL1, OL2, and OL3 may include first electrodes AE-1, AE-2, and AE-3 and emission layers EML1, EML2, and EML3, respectively, which are disposed to be spaced apart from each other, and include the second electrode CE (or common electrode) which is commonly disposed. Although not separately illustrated in FIGS. 9A and 9B, the plurality of light emitting elements OL1, OL2, and OL3 each may further include the hole control layer HCL and the electron control layer ECL in FIG. 4. Hereinafter, the plurality of light emitting elements OL1, OL2, and OL3 will be referred to as a first light emitting element OL1, a second light emitting element OL2, and a third light emitting element OL3, respectively.

A plurality of light emitting openings OP-1, OP-2, and OP-3 may be defined in the pixel defining film PDL. The light emitting openings OP-1, OP-2, and OP-3 may include a first light emitting opening OP-1, a second light emitting opening OP-2, and a third light emitting opening OP-3.

The first light emitting opening OP-1 may expose at least a portion of the first electrode AE-1 of the first light emitting element OL1, and the area of the first electrode AE-1 exposed by the first light emitting opening OP-1 may correspond to the first light emitting region PXA-1. The second light emitting opening OP-2 may expose at least a portion of the first electrode AE-2 of the second light emitting element OL2, and the area of the first electrode AE-2 exposed by the second light emitting opening OP-2 may correspond to the second light emitting region PXA-2. The third light emitting opening OP-3 may expose at least a portion of the first electrode AE-3 of the third light emitting element OL3, and the area of the first electrode AE-3 exposed by the third light emitting opening OP-3 may correspond to the third light emitting region PXA-3.

The emission layers EML1, EML2, and EML3 of the plurality of light emitting elements OL1, OL2, and OL3 may be disposed to correspond to the light emitting openings OP-1, OP-2, and OP-3, respectively. The emission layers EML1, EML2, and EML3 may each include an organic light emitting material or an inorganic light emitting material. The emission layers EML1, EML2, and EML3 may each generate a different color light. For example, the emission layer EML1 of the first light emitting element OL1 may generate a red light, the emission layer EML2 of the second light emitting element OL2 may generate a green light, and the emission layer EML3 of the third light emitting element OL3 may generate a blue light. However, the embodiment of the inventive concept is not limited thereto, and the emission layers EML1, EML2, and EML3 may each generate the same color light. The emission layers EML1, EML2, and EML3 of an embodiment may be integrally formed and be disposed on the first electrodes AE-1, AE-2, and AE-3 in common.

The input sensing layer ISL may be directly disposed on the encapsulation layer TFL. The input sensing layer ISL may include a first insulating layer IS-IL1, a first conductive layer IS-CL1, a second insulating layer IS-IL2, a second conductive layer IS-CL2, and a third insulating layer IS-IL3. In an embodiment, at least one of the first insulating layer IS-IL1 and/or the third insulating layer IS-IL3 may be omitted.

Each of the first conductive layer IS-CL1 and the second conductive layer IS-CL2 may have a single-layered structure or a multilayered structure in which a plurality of layers are stacked in the thickness direction. The conductive layers IS-CL1 and IS-CL2 having the multilayered structure may include at least two of transparent conductive layers and/or metal layers. The transparent conductive layer may include at least one of indium tin oxide (ITO), indium zinc oxide (IZO), zinc oxide (ZnO), indium tin zinc oxide (ITZO), PEDOT, a metal nano wire, and/or graphene. The metal layer may include molybdenum, silver, titanium, copper, aluminum, and/or an alloy thereof.

The conductive layers IS-CL1 and IS-CL2 having the multilayered structure may include metal layers containing different metals. For example, each of the first conductive layer IS-CL1 and the second conductive layer IS-CL2 may have a three-layered metal structure such as a structure of titanium/aluminum/titanium. Metal layers having relatively high durability and low reflectivity may be disposed on an upper layer and a lower layer, and a metal layer having high electrical conductivity may be disposed on an intermediate layer.

The first conductive layer IS-CL1 and the second conductive layer IS-CL2 may include conductive patterns constituting detection electrodes and signal lines connected to the detection electrodes. The conductive patterns may be disposed to overlap a light shielding pattern BM. The light shielding pattern BM may prevent the external light incident to the conductive patterns from being reflected.

Each of the first insulating layer IS-IL1, the second insulating layer IS-IL2, and the third insulating layer IS-IL3 may include an inorganic film or an organic film. In an embodiment, the first insulating layer IS-IL1 and the second insulating layer IS-IL2 may include an inorganic film, and the third insulating layer IS-IL3 may include an organic film, but the embodiment is not limited thereto.

In the light shielding pattern BM, the above-described first opening OP1-BM, second opening OP2-BM, and third opening OP3-BM may be defined. The first opening OP1-BM, the second opening OP2-BM, and the third opening OP3-BM, may correspond to the first light emitting opening OP-1, the second light emitting opening OP-2, and the third light emitting opening OP-3, respectively. The area of the openings OP1-BM, OP2-BM, and OP3-BM of the light shielding pattern BM may be equal to or greater than the area of the corresponding light emitting openings OP-1, OP-2, and OP-3 of the pixel defining film PDL, respectively.

The anti-reflection member ARP may be disposed on the input sensing layer ISL. The anti-reflection member ARP may include the light shielding pattern BM, the plurality of color filters CF-1, CF-2, and CF-3, and an overcoating layer OCL. The above description may be equally applied to the description of the light shielding pattern BM and the plurality of color filters CF-1, CF-2, and CF-3.

The first color filter CF-1 may be disposed on the first light emitting element OL1, and may overlap the first light emitting region PXA-1. The second color filter CF-2 may be disposed on the second light emitting element OL2, and may overlap the second light emitting region PXA-2. The third color filter CF-3 may be disposed on the third light emitting element OL3, and may overlap the third light emitting region PXA-3. At least one of the first color filter CF-1, the second color filter CF-2, and/or the third color filter CF-3 may be the gray filter as described above.

The overcoating layer OCL may be disposed on the first to third color filters CF-1, CF-2, and CF-3 and protect the first to third color filters CF-1, CF-2, and CF-3. The overcoating layer OCL may include an organic material and provide a flat upper surface. In an embodiment, the overcoating layer OCL may be omitted.

Referring to FIG. 9B, the overcoating layer OCL of an embodiment may include a base resin and a dye and/or a pigment dispersed in the base resin. The overcoating layer OCL may include the same material as the color filter constituting the gray filter. FIG. 9B illustrates an embodiment in which the gray filter is the second color filter CF-2.

The overcoating layer OCL may be integrally formed with the second color filter CF-2 composed of the gray filter. Each of the first color filter CF-1 and the third color filter CF-3 is formed on the light shielding pattern BM, and the second color filter CF-2 and the overcoating layer OCL may be formed simultaneously. That is, the base resin, in which the dye or the pigment forming the gray filter is dispersed, is applied on the first color filter CF-1, the third color filter CF-3, and the second opening OP2-BM of the light shielding pattern BM to form the second color filter CF-2 and the overcoating layer OCL in a single body. Accordingly, a mask process for forming the gray filter may be omitted, and a process for forming the anti-reflection member ARP may be simplified.

FIG. 9B is an example to illustrate the second color filter CF-2 integrally formed with the overcoating layer OCL, but the overcoating layer OCL is not limited to any one embodiment as long as it is integrally formed with the gray filter. For example, if the first color filter CF-1 is the gray filter, the overcoating layer OCL may be integrally formed with the first color filter CF-1.

Figure 10:
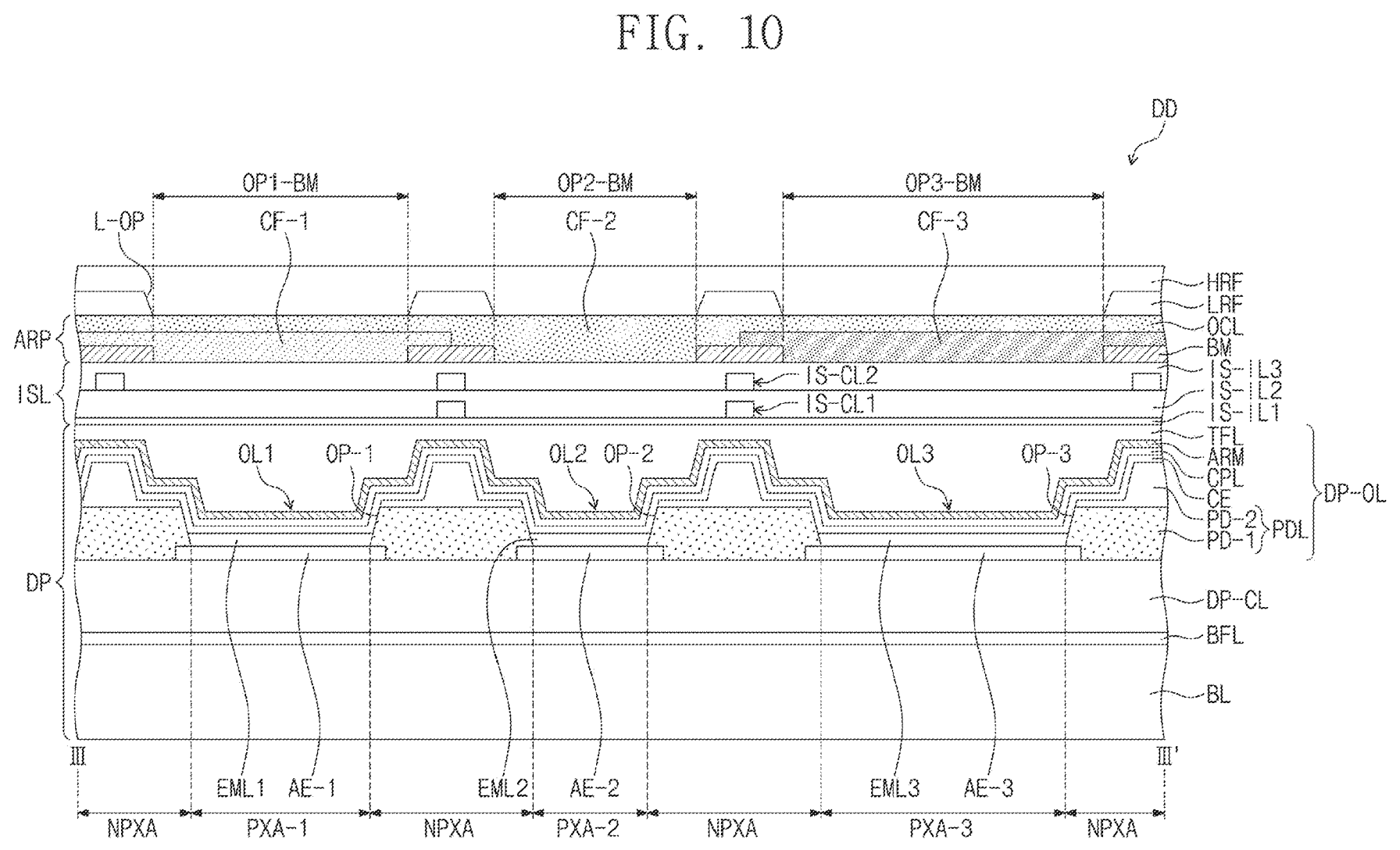

FIG. 10 is a cross-sectional view of a display device according to an embodiment. The display device of FIG. 10 includes the substantially same components as the display device DD of FIG. 9B, and has a difference in some components, and the above description may be equally applied to the substantially same components. Hereinafter, differences will be mainly described with reference to FIG. 10.

Referring to FIG. 10, the pixel defining film PDL may include a first defining film PD-1 and a second defining film PD-2. The first defining film PD-1 may be disposed on the circuit element layer DP-CL. The plurality of light emitting openings OP-1, OP-2, and OP-3 exposing a portion of each of the first electrodes AE-1, AE-2, and AE-3 may be defined in the first defining film PD-1. A portion of the first defining film PD-1 may be disposed on the first electrodes AE-1, AE-2, and AE-3.

The first defining film PD-1 may have a black color. The first defining film PD-1 may include a base resin and a black pigment and/or a black dye mixed in the base resin.

The second defining film PD-2 may be disposed on the first defining film PD-1. The second defining film PD-2 may include a protrusion portion protruding toward the input sensing layer ISL in the thickness direction. The second defining film PD-2 may have a function as a spacer. The second defining film PD-2 may protect a plurality of light emitting elements OL1, OL2, and OL3 by buffering an external force applied thereto. The second defining film PD-2 of an embodiment may prevent the external light reflection by scattering the external light reflected by conductive patterns of the circuit element layer DP-CL disposed below the pixel defining film PDL.

The second defining film PD-2 may include a transparent organic material. The second defining film PD-2 may include an organic material different from the material contained in the first defining film PD-1. However, the embodiment of the inventive concept is not limited thereto, and the second defining film PD-2 may include the same material as the first defining film PD-1.

The display element layer DP-OL of an embodiment may further include a capping layer CPL and a low reflection layer ARM. The capping layer CPL may be disposed on the second electrode CE. The capping layer CPL may include an organic film or an inorganic film. The capping layer CPL may control a phase difference between the second electrode CE and the low reflection layer ARM. Thus, the capping layer CPL may prevent or protect from an interference phenomenon of light due to the phase difference.

The low reflection layer ARM may be disposed on the capping layer CPL. The low reflection layer ARM may reduce the external light reflection rate by using the destructive interference of light due to the thickness between stacks and/or materials. The low reflection layer ARM may include a metal material. For example, the low reflection layer ARM may include bismuth (Bi), ytterbium (Yb), manganese (Mn), and/or a compound of Yb and Bi ($Yb_xBi_y$), but the material of the low reflection layer ARM is not limited thereto.

The low reflection layer ARM may have a set or predetermined thickness and be deposited on the capping layer CPL. For example, the thickness of the low reflection layer ARM may be about 50 Å to about 150 Å. However, the thickness of the low reflection layer ARM is not limited thereto.

The display device DD of an embodiment may further include a first refractive layer LRF and a second refractive layer HRF disposed on the anti-reflection member ARP. The first refractive layer LRF may be disposed on the overcoating layer OCL of the anti-reflection member ARP. Openings L-OP may be defined in the first refractive layer LRF. The openings L-OP of the first refractive layer LRF may be defined to correspond to the plurality of light emitting regions PXA-1, PXA-2, and PXA-3, and the first refractive layer LRF may be disposed to overlap the non-light emitting region NPXA.

The second refractive layer HRF may be disposed on the first refractive layer LRF. The second refractive layer HRF may be disposed to overlap the plurality of light emitting regions PXA-1, PXA-2, and PXA-3 and the non-light emitting region NPXA. The second refractive layer HRF may cover the interior of the openings L-OP of the first refractive layer LRF, and provide a flat upper surface.

Each of the first refractive layer LRF and the second refractive layer HRF may have a set or predetermined refractive index. The refractive index of the second refractive layer HRF may be greater than that of the first refractive layer LRF. Accordingly, a total reflection phenomenon may occur at the interface between the second refractive layer HRF and the first refractive layer LRF.

Some of the lights generated from the plurality of light emitting elements OL1, OL2, and OL3 may be incident toward an inclined surface formed by the openings L-OP of the first refractive layer LRF, and the lights may be reflected by the total reflection and then move upwards. Accordingly, the front brightness of the display device DD may increase.

The refractive index of the first refractive layer LRF may be about 1.3 to about 1.6. Specifically, the refractive index of the first refractive layer LRF may be about 1.4 to about 1.55. The first refractive layer LRF may include an acryl-based organic material having a refractive index of about 1.5. For example, the first refractive layer LRF may include at least one of ethylhexyl acrylate, pentafluoro-propyl acrylate, poly(ethylene glycol) dimethacrylate, and/or ethylene glycol dimethacrylate.

The refractive index of the second refractive layer HRF may be about 1.6 to about 1.9. Specifically, the refractive index of the second refractive layer HRF may be about 1.65 to about 1.85. The second refractive layer HRF may include an acryl-based or siloxane-based organic material having a refractive index of about 1.6. For example, the second refractive layer HRF may include at least one of methyltrimethoxysilane, tetramethoxysilane, or polydiarylsiloxane.

The second refractive layer HRF of an embodiment may further include dispersion particles in order to have a relatively high refractive index. For example, the second refractive layer HRF may include metal oxide particles such as a zinc oxide ($ZnO_x$), a titanium oxide ($TiO_2$), or a zirconium oxide ($ZrO_2$).

Figure 11A:
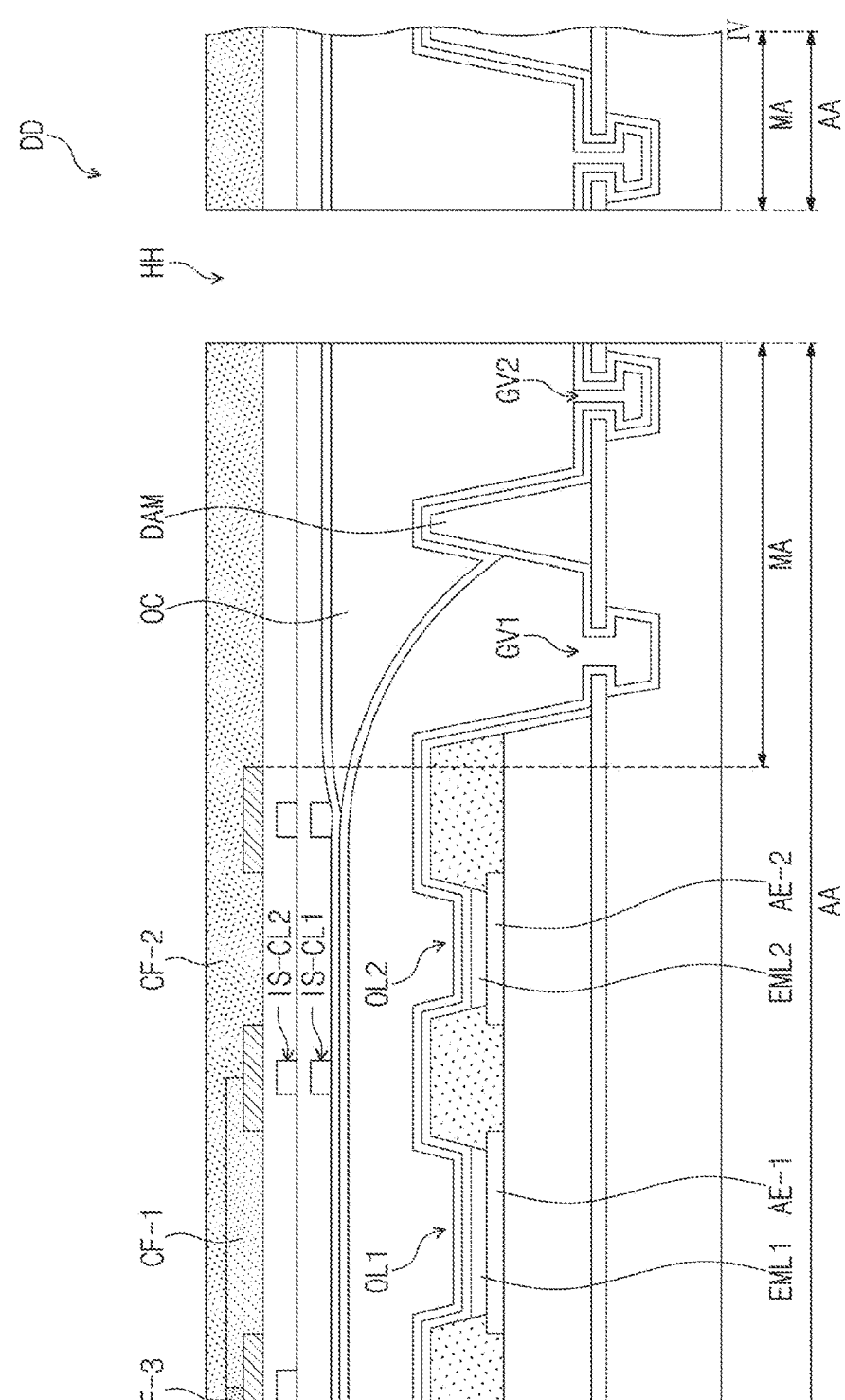
FIGS. 11A and 11B are cross-sectional views of display devices according to embodiments of the present disclosure taken along line IV-IV' of FIG. 1B.
Figure 11B:
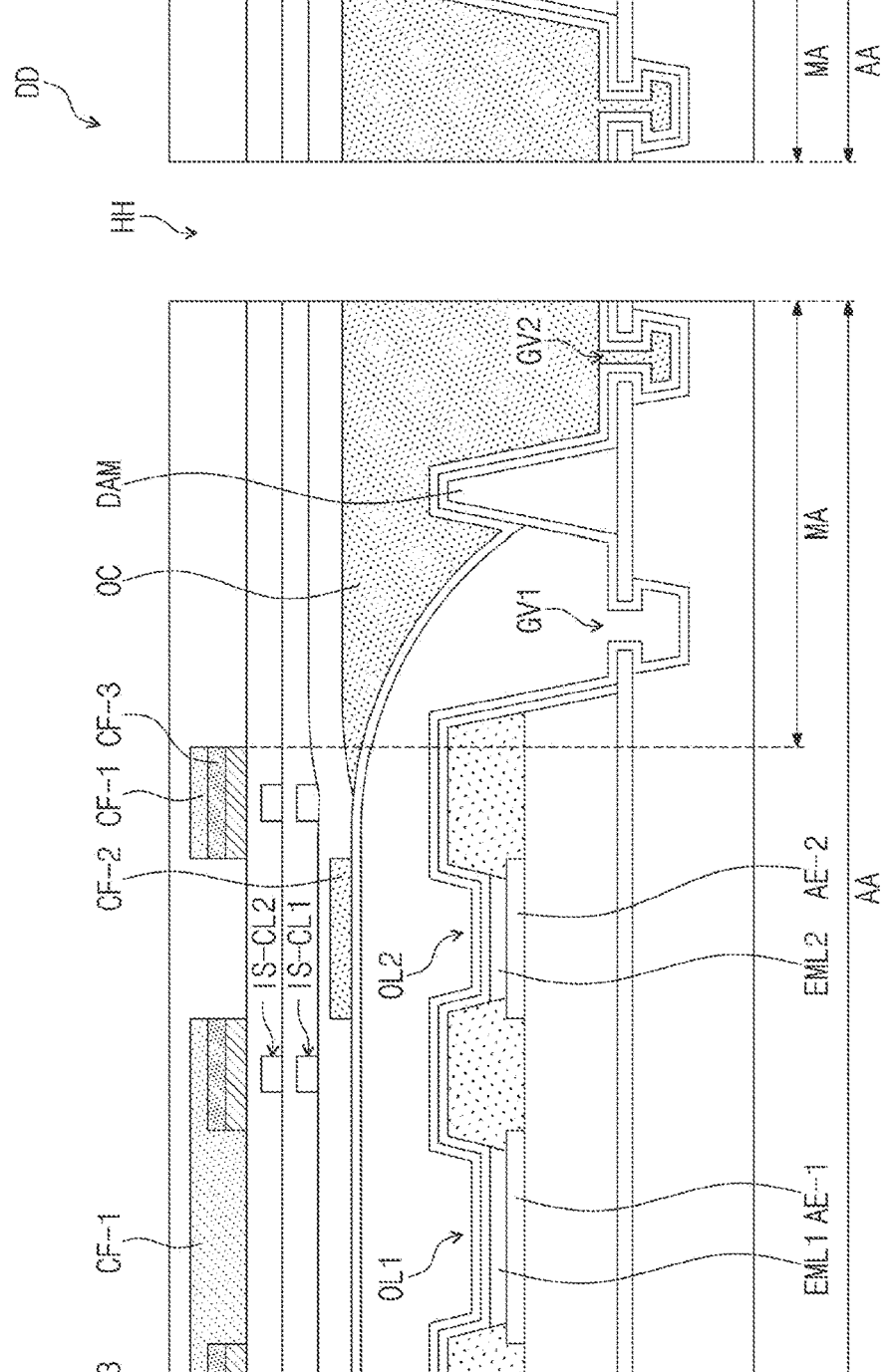

FIGS. 11A and 11B illustrate cross-sections of display devices corresponding to those taken along the line IV-IV' in FIG. 1B. FIGS. 11A and 11B illustrate cross-sections corresponding to the hole HH defined in the display module DM and a portion of the active region AA surrounding the hole HH. The display devices DD in FIGS. 11A and 11B may have the substantially same components as the above-described display device DD, and the above description may be equally applied thereto. FIGS. 11A and 11B are examples to illustrate cross-sections of some light emitting elements OL1 and OL2 among the plurality of light emitting elements, which will be described later on the basis of these.

Referring to FIG. 11A, the encapsulation layer TFL may include first and second inorganic films 101 and 102 and an organic film MN. The organic film MN may be disposed between the first inorganic film 101 and the second inorganic film 102. The above description may be equally applied to the description of the first and second inorganic films 101 and 102 and the organic film MN constituting the encapsulation layer TFL.

The active region AA may include the margin region MA. The margin region MA may be a region in which the plurality of light emitting elements OL1 and OL2 are not disposed. The margin region MA may surround the hole HH.

The hole HH may be formed to penetrate the display panel DP, the input sensing layer ISL, and the anti-reflection member ARP in the margin region MA. The hole HH may be formed by stacking the display panel DP, the input sensing layer ISL, and the anti-reflection member ARP, and then irradiating, with a laser, a portion within the margin region MA. In some embodiments, the electronic module EM in FIG. 1B may be inserted into the hole HH.

The display device DD may include a first groove GV1 and a second groove GV2 recessed from an upper surface of the base layer BL. Each of the first groove GV1 and the second groove GV2 may have a shape which is concavely recessed from the upper surface of the base layer BL. Each of the first groove GV1 and the second groove GV2 may have an undercut shape on a cross-section.

An inner surface of the first groove GV1 may be covered by the first inorganic film 101 of the encapsulation layer TFL, and the interior of the first groove GV1 may be filled with the organic film MN. The second groove GV2 may be spaced apart from the first groove GV1 with a dam part DAM, which will be described later, interposed therebetween. An inner surface of the second groove GV2 may be covered by the first and second inorganic films 101 and 102 of the encapsulation layer TFL, and the interior of the second groove GV2 may be filled with a compensation layer OC.

The first and second grooves GV1 and GV2 may each be disposed in the margin region MA to surround or be around the hole HH. The first and second grooves GV1 and GV2 may have a closed-line shape surrounding the hole HH. The first and second grooves GV1 and GV2 may prevent or protect from the damage of the light emitting elements OL1 and OL2 in the active region AA by blocking a penetration path of external moisture or oxygen.

The display device DD may include the dam part DAM. The dam part DAM may be disposed on the base layer BL and overlapped in the margin region MA. The dam part DAM may be disposed between the first groove GV1 and the second groove GV2. The dam part DAM may prevent the organic film MN of the encapsulation layer TFL from extending to the margin region MA.

In some embodiments, the dam part DAM may have a multi-layered structure including a plurality of insulating layers. The dam part DAM may be formed in the same process as those of the pixel defining film PDL and some of the plurality of insulating layers constituting the circuit element layer DP-CL. However, the embodiment of the inventive concept is not limited thereto, and the dam part DAM may have a single-layered structure.

The organic film MN of the encapsulation layer TFL may be sealed by the dam part DAM and the inorganic film 102 disposed on the dam part DAM. Accordingly, this may prevent or protect the light emitting elements OL1 and OL2 from being damaged due to moisture and/or oxygen introduced through the hole HH.

The display device DD may include the compensation layer OC. The compensation layer OC may be disposed on the encapsulation layer TFL. The compensation layer OC may be disposed in the margin region MA to surround or be around the periphery of the hole HH.

The compensation layer OC may include an organic material. The compensation layer OC may cover a non-flat surface defined by the dam part DAM and the second groove GV2 to provide a flat surface for the upper part. The first to third insulating layers IS-IL1, IS-IL2, and IS-IL3 of the input sensing layer ISL may be disposed on the compensation layer OC providing the flat upper surface.

Referring to FIG. 11A, the anti-reflection member ARP may include the same components as the embodiment of FIG. 9B. The second color filter CF-2 that is the gray filter may be disposed on the same layer as the first and third color filters CF-1 and CF-3. The second color filter CF-2 may include the same material as an overcoating layer OCL disposed on the first to third color filters CF-1, CF-2, and CF-3, and may be integrally formed with the overcoating layer OCL.

Referring to FIG. 11B, the second color filter CF-2 that is the gray filter may be disposed on a layer different from the first and third color filters CF-1 and CF-3. The second color filter CF-2 may be disposed on the encapsulation layer TFL to overlap the second light emitting element OL2. The second color filter CF-2 is disposed on a lower part of a light shielding pattern BM, and thus a portion of the overcoating layer OCL may be disposed on the same layer as the first and third color filters CF-1 and CF-3.

In an embodiment, the second color filter CF-2 may be formed through the same process as the compensation layer OC. The compensation layer OC may include the same material as the second color filter CF-2. That is, the compensation layer OC may include the same material as the gray filter. However, the embodiment is not limited thereto.

A portion of the first color filter CF-1 and the third color filter CF-3 may be disposed on the light shielding pattern BM to overlap the same. The first and third color filters CF-1 and CF-3 stacked on the light shielding pattern BM to overlap the same may control the external light reflection rate of the upper region of the light shielding pattern BM.

The display device according to an embodiment may include the anti-reflection member, and the anti-reflection member may include the gray filter. The gray filter may be prevented or protected from the deterioration or discoloration due to the external ultraviolet light. The gray filter may make the external light reflection rate of the display device reduced and the display device have a set or predetermined light output efficiency, and simultaneously or concurrently prevent or protect from the brightness reduction issue of the display device with respect to a particular color. In addition, the gray filter may prevent or protect the black reflected light from shifting to have a particular color quality.

An embodiment includes color filters through which all color lights in a particular wavelength range pass at a set or predetermined rate, thereby improving the reduction phenomenon of the visibility caused by external light reflection and simultaneously or concurrently preventing or protecting from a change in colors caused by external light.

By integrally forming the color filter and the overcoating layer, an embodiment may reduce the number of masks required in manufacturing processes of the display device and simplify the manufacturing processes of the display device.

Although embodiments of the present disclosure have been described with reference to certain example embodiments, it will be understood that the inventive concept should not be limited to these examples embodiments but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims and equivalents thereof.

What is claimed is:

1. A display device comprising:

a display panel comprising a plurality of light emitting elements; and a plurality of color filters arranged to overlap the plurality of light emitting elements, respectively, wherein the plurality of color filters comprises:

first color filters having a light transmittance of 80% or less to each of a first color light, a second color light, and a third color light; and second color filters that have higher light transmittance to the first color light than the first color filters and have lower light transmittance to the second color light than the first color filters;

wherein each of the plurality of light emitting elements is to emit one of the first color light, the second color light or the third color light, and each of the first color light, the second color light and the third color light is selected from among a red light, a green light, and a blue light; and wherein the first color filters overlap light emitting elements of the plurality of light emitting elements.

2. The display device of claim 1, wherein each of the first color filters has a light transmittance of about 50% or more to each of the first color light and the second color light.

3. The display device of claim 1, wherein each of the first color light and the second color light is selected from the red light, the green light, and the blue light, and the second color light is different from the first color light.

4. The display device of claim 1, further comprising an overcoating layer on the plurality of color filters, wherein the overcoating layer comprises the same material as the first color filters.

5. The display device of claim 1, wherein the plurality of color filters further comprises third color filters that have higher light transmittance to the second color light than the first color filters and have lower light transmittance to the first color light than the first color filters.

6. The display device of claim 5, wherein the plurality of light emitting elements comprise:

first light emitting elements configured to emit the first color light;

second light emitting elements configured to emit the second color light; and third light emitting elements configured to emit the third color light different from each of the first color light and the second color light, and the first color filters overlap the third light emitting elements, respectively, the second color filters overlap the first light emitting elements, respectively, and the third color filters overlap the second light emitting elements, respectively.

7. The display device of claim 5, wherein the first color filters are spaced apart from each other in a plan view.

8. The display device of claim 5, wherein the first color filters are connected to each other in a plan view, and the second color filters and the third color filters are each spaced apart from each other with the first color filters interposed therebetween.

9. The display device of claim 5, further comprising a light shielding pattern on the display panel, wherein the light shielding pattern has a plurality of openings defined therein and respectively corresponding to the plurality of light emitting elements, and the first color filters, the second color filters, and the third color filters are on the plurality of openings, respectively.

10. The display device of claim 9, wherein a portion of the second color filters and a portion of the third color filters overlap each other on the light shielding pattern.

11. The display device of claim 1, further comprising an input sensing layer on the display panel to detect an external input, wherein the input sensing layer comprises:

a first conductive layer;

a first insulating layer on the first conductive layer;

a second conductive layer on the first insulating layer; and a second insulating layer on the second conductive layer.

12. The display device of claim 11, wherein each of the first color filters and the second color filters is on the input sensing layer.

13. The display device of claim 11, wherein each of the first color filters is below the input sensing layer and each of the second color filters is above the input sensing layer.

14. The display device of claim 1, wherein the display panel further comprises:

a pixel defining film in which a plurality of light emitting openings are defined; and an encapsulation layer on the plurality of light emitting elements, wherein the plurality of light emitting elements are to respectively correspond to the plurality of light emitting openings, and the pixel defining film comprises a black pigment and/or a black dye.

15. The display device of claim 14, wherein the display panel further comprises a low reflection layer disposed between the plurality of light emitting elements and the encapsulation layer, and the low reflection layer comprises a metal material.

16. The display device of claim 14, wherein the display panel has a hole passing therethrough, and further comprises a compensation layer around the hole, and the compensation layer does not overlap the plurality of light emitting elements and comprises the same material as the first color filters.

17. The display device of claim 1, further comprising:

a first refractive layer on the plurality of color filters; and a second refractive layer on the first refractive layer, wherein the first refractive layer has a plurality of openings defined therein and respectively corresponding to the plurality of light emitting elements, the second refractive layer fills the plurality of openings, and a refractive index of the second refractive layer is greater than that of the first refractive layer.

18. An electronic device comprising:

a display device comprising:

a display panel comprising a plurality of light emitting elements;

an input sensing layer on the display panel and comprising at least one conductive layer and at least one insulating layer; and a plurality of color filters on the input sensing layer and overlapping the plurality of light emitting elements, respectively, wherein the plurality of color filters comprise a gray filter, a first color filter, and a second color filter different from the first color filter, the first color filter and the second color filter are at least selected from among a red color filter, a green color filter, and a blue color filter, the gray filter transmits 50% or more of each of a red light, a green light, and a blue light, each of the plurality of light emitting elements is to emit one selected from among the red light, the green light, and the blue light, and the first color filters overlap light emitting elements of the plurality of light emitting elements.

19. The electronic device of claim 18, wherein the gray filter has light transmittance of 80% or less to each of the red light, the green light, and the blue light.

20. The electronic device of claim 18, wherein the first color filter is the red color filter, and the second color filter is the blue color filter.

* * * * *